(12) United States Patent
Schmidt et al.

(10) Patent No.: US 6,218,628 B1
(45) Date of Patent: *Apr. 17, 2001

(54) FOIL CIRCUIT BOARDS AND SEMIFINISHED PRODUCTS AND METHOD FOR THE MANUFACTURE THEREOF

(75) Inventors: Walter Schmidt, Zürich; Marco Martinelli, Neftenbach, both of (CH)

(73) Assignee: Dyconex Patente AG, Zug (CH)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/581,625
(22) PCT Filed: May 18, 1994
(86) PCT No.: PCT/CH94/00092
§ 371 Date: Jan. 18, 1996
§ 102(e) Date: Jan. 18, 1996
(87) PCT Pub. No.: WO95/31883
PCT Pub. Date: Nov. 23, 1995
(51) Int. Cl.⁷ ..................................................... H05K 3/04
(52) U.S. Cl. .............................. 174/250; 29/827; 29/855; 427/96; 428/209
(58) Field of Search ............................ 174/250, 260, 174/262, 264, 266, 254; 361/777; 427/96; 428/209; 29/827, 835, 855, 885; 368/239

(56) References Cited

U.S. PATENT DOCUMENTS

| | | | |
|---|---|---|---|
| 3,747,210 | * | 7/1973 | Kroll . |
| 4,391,531 | * | 7/1983 | Yokota et al. ......................... 368/239 |
| 4,711,791 | | 12/1987 | Wiseman et al. ........................ 427/96 |
| 4,786,545 | * | 11/1988 | Sakuma et al. ......................... 428/209 |
| 5,306,872 | * | 4/1994 | Kordus et al. .......................... 174/250 |
| 5,436,062 | | 7/1995 | Schmidt et al. ........................ 428/209 |
| 5,446,245 | * | 8/1995 | Iwayama et al. ....................... 174/261 |

FOREIGN PATENT DOCUMENTS

| | | |
|---|---|---|
| 1085209 | * 7/1960 | (DE) . |
| WO 93/26143 | 12/1993 | (WO) . |

OTHER PUBLICATIONS

Sagara Hideji etal, Manufacture of Printed Circuit Board, JP4042594 published 13–02–92, Dainippon Printing Company Ltd., Patent Abstracts of Japan vol. 16, No. 227.

* cited by examiner

Primary Examiner—Hyung-Sub Sough
(74) Attorney, Agent, or Firm—Rankin, Hill, Porter & Clark LLP

(57) ABSTRACT

A method for the manufacture of printed circuit boards, foil circuit boards and semifinished products for printed and foil circuit boards formed from preliminary products with electrically conductive coatings (7, 8) structurable to conductor patterns and structurable substrates (4), for the formation of connectors (V), contours (K) and conductor patterns (L), the connectors (V), contours (K) and conductor patterns (L) being structured simultaneously or in the same method steps from the preliminary products, and the connectors (V) and contours (K) are part of the structured preliminary product substrate, the connectors (V) being brought for electrical or mechanical connection into a position in which they are connectable and the finished conductor patterns (L) can be separated at contours (K).

16 Claims, 15 Drawing Sheets

FOIL CIRCUIT BOARDS AND SEMIFINISHED PRODUCTS AND METHOD FOR THE MANUFACTURE THEREOF

FIELD OF THE INVENTION

The invention is in the field of the manufacture of printed circuit boards and foil circuit boards and relates to a method for the manufacture of printed circuit boards, foil circuit boards and semifinished products for such circuit boards and relates to printed circuit boards, foil circuit boards and semifinished products for such circuit boards manufactured according to the method.

BACKGROUND OF THE INVENTION

In many fields of modern electronics circuit carriers such as e.g. printed circuits are mechanically and also electrically connected to integrated circuits (ICs) or other active and/or passive electronic components. This normally takes place by means of plug and socket or soldered connections. The connections for the components are in many cases shaped as soldered or plug connection leads and are mechanically fixed by means of the components to the printed circuit board or foil circuit board and electrically connected thereto,, To an increasing extent unhoused components ("bare" ICs) are directly applied to circuit boards or connecting substrates. The electrical connections between the component and connecting substrate are provided either by wire bonding, TAB or flip clip methods. These assembly methods are now very important, due to the constantly rising complexity of electronic functions, because they can lead to space and cost savings.

However, usually such circuits are designed in the form of modular components, which in principle represent higher Integrated components. However, such modules must be mechanically and electrically connected to the printed or foil circuit board, so that the modular component once again requires leads. The latter can be constructed in various ways, but are generally applied as pre-fabricated, comb-like structured leads and are in this way soldered to the circuit.

Circuits in foil circuit boards are often used as flat band cables and can also be provided with leads in accordance with the above-described method, but in general plugs are soldered on and can be electrically and mechanically connected to counterplugs. It is characteristic of such connections that a first element (modular component, printed or foil circuit board) and a second element (printed or foil circuit board, etc.) must be mechanically and electrically interconnected. This means that for the formation of an electrical connection of a single current path two electrical connection points are required, which not only involves costs, but also has a negative influence on reliability. In addition, the connection point cannot be utilized in an optimum manner. The conductor pattern, all the current paths, insulating areas, openings and plated-through holes must be adapted for application purposes. For example current paths are mechanically reinforced or are modified with regards to their physical extension in the vicinity of the application of the connecting means. For assembly reasons leads are often made much thicker than necessary. Soldering pads are frequently made wider than the current paths, etc. passed up to them. These precautions require methods with in part, complicated processing steps and take up time and space.

Circuits with more complex contours are, according to the prior art, manufactured by known manufacturing methods with material and known means for the individual stages, so that these circuits have readily manipulatable shapes, i.e. for circuit boards they comprise rectangular or square material pieces or with foil circuit boards quasi-endless material from a reel. Only in one of the last operations are the circuits milled or punched out from the substrate in accordance with their definitive contours. However, this final cutting to size places limits on the complexity of the contours. The more complex the shape and the smaller the individual dimensions of the printed and foil circuit boards to be produced, the more difficult and complicated said final cutting to size.

With smaller numbers, where the manufacture of punching tools is not worthwhile, cutting out takes place by milling. If thin foil material is to be milled, so as to prevent any displacement upstream of the tool, it is necessary to ensure that fixing occurs between rigid carrier materials. The carrier materials are also milled and constitute an expensive auxiliary material. Despite the carrier materials used the precision of the milling step is limited and in particular no very narrow areas can be milled, because milling is a sequential process and the displacement of the material increases if successively close together milling cuts are made. A further problem is the fraying of the milled edges, which involves expensive, manual after-work. Punching is advantageously used for larger numbers. The tool for such a punching step can e.g. be a knife-like, ground, flexible steel band inserted in a recess of a base plate, so that a randomly shaped recess can be produced. However, it is scarcely possible to obtain radii of curvature below approximately 3 mm. In addition, the service life for such tools is approximately 1000 strokes and the accuracy of cut is at most ±0.2 mm. Better punching precisions can be obtained with hard-enable steel tools. Such tools are made by spark erosion, but are much more expensive than the aforementioned steel band or strip punching tools. In any case a complicated and expensive punching machine is required, so that the final cutting to size of circuits by punching is very expensive.

It would be desirable to so integrate the application of mechanical structures or patterns for connecting means and contours such as leads, plugs, soldering pads, holes, grooves, etc. in printed and foil circuit boards, that the necessary costs and space consumption are kept to a minimum. It must be possible to use known and proven processing steps, as well as corresponding tools and apparatus.

SUMMARY OF THE INVENTION

An object of the invention is to provide a method for the manufacture of printed circuit boards, foil circuit boards and semifinished products for such circuit boards, where the structures or patterns for connecting means and contours are applied during the manufacture of the foil and printed circuit boards in the substrate of the latter and do not have to be subsequently made.

The invention is based on the observation that in insulating layers and substrates of printed and foil circuit boards not only can simple structures such as blind- or through-holes be formed by plasma etching, but also complicated structures. This offers new degrees of freedom in the design of printed and foil circuit boards.

This innovation is the integration of the manufacture of functionally outwardly directed connecting means and contours around conductor patterns in the substrate in the manufacture of conductor patterns or internal structures of the printed or foil circuit boards. The connecting means are e.g. used for power supply purposes, for connection to other circuits or for connection to other areas of the same conductor pattern and the contours serve as prefabricated fragments for separating conductor patterns from the substrate.

Thus, there is an integration of the connecting means and contours in or on the substrate in the structuring of the conductor pattern and relates to the structuring of current paths, insulating areas, openings, plated-through holes, webs, grooves, etc.

In the method according to the invention, three-dimensional structures such as leads, matching connecting openings with current paths, flexible leads and shielded cables as connecting means and openings, webs and grooves as contour lines are produced during the photochemical structuring of the printed and foil circuit boards and their semifinished products. In the sense of an advantageous, very tight surface-covering conductor pattern, the connecting means and contours for the same are incorporated into the conductor pattern production so that simultaneously or in the same method and using identical or similar marks can be manufactured like them from preliminary products.

The connecting means and contours are worked in fixed form in or on the substrate. They do not consequently have to be subsequently applied to the finished printed or foil circuit boards and are instead already parts thereof during manufacture. The difference between the connecting means and contours is that the connecting means are coated with electrically conductive layers and are only partly detached from the substrate, whereas the contours are electrically insulating and allow a complete release of finished conductor patterns from the substrate.

Therefore connecting means are partly releasable from the substrate and spatially orientable and consequently fulfil connecting functions. They are provided with led-up current paths and for assembly reasons no longer have to undergo mechanical reinforcement or any modification of their extension.

Contours are already contained in a virtually finished state in the substrate, i.e. in the form of a completely separable contour line. Such contour openings are separated from one another by connecting webs or posts and extend through the entire substrate thickness. It is subsequently sufficient to separate the connecting webs, which in the case of a corresponding arrangement of the webs with little precision can be performed manually e.g. with scissors. This is possible if the connecting webs are very narrow and are located at positions where maximum precision is not needed. Through the connecting webs the resulting conductor patterns remain connected to one another or to the remaining material even after the contour openings have been produced and the easily manipulatable form of the material per se is maintained up to the end of the method.

The method according to the invention comprises building up the conductor patterns as intermediate products from one or more foil material layers, the foil material being in pieces or quasi-endless. The structures or patterns such as circuit-relevant openings and contour openings are produced in the same method.

Such conductor patterns are flexible and thin over their entire surfaces, i.e. they can comprise one or a few superimposed foil layers, but can also have rigid areas on which the number of superimposed foil layers is larger than the flexible areas, or they can be zonally stiffened by correspondingly shaped carrier elements, e.g. by a foil circuit board being drawn onto the same.

With certain constructions and method variants the printed circuit boards have flexible marginal areas over which pass a plurality of conducting paths or current paths substantially parallel to one another and towards the edge. At the point where the conducting paths reach the edge of the conductor patterns, the edge is not worked linearly and has instead slot-like openings or depressions, which extend between the conductor patterns in such a way that the outermost ends of the conducting paths individually is placed on a corresponding, lip-like shape. The slot-like openings between the conducting path ends to be soldered prevent an easy flowing away of the solder, so that the conducting paths can be closely juxtaposed and the flowing away of solder causes no problems.

BRIEF DESCRIPTION OF THE DRAWINGS

Preferred embodiments of according to the invention are described in greater detail hereinafter with reference to the attached drawings wherein.

DESCRIPTION OF PREFERRED EMBODIMENTS

Figure 1:
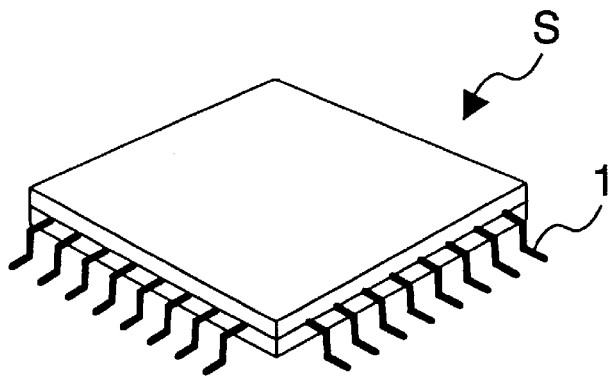
FIG. 1 is a perspective view of part of an embodiment of a circuit carrier which can be assembled on printed and foil circuit boards.

FIG. 1 perspectively shows part of an embodiment of a circuit carrier assemblable on printed and foil circuit boards. Such circuit carriers S can e.g. be single-chip modules (SCMs) or multichip modules (MCMs), whose integrated circuit is located in a casing or housing for protection against mechanical damage and harmful environmental influences. The leads 1 fixed to the connecting substrate of the chip or in the casing can be plugged or soldered to holes or solder surfaces of printed or foil circuit boards. They are generally made from metal such as copper and gold-coated copper and typically have diameters of 0.3 to 1 mm and lengths of 3 to 10 mm. The leads 1 are often fitted at regular intervals of 0.3 to 2.54 mm, as a function of the component size, on lateral boundaries of the circuit carrier S. Their counterparts, the holes or solder surfaces of printed and foil circuit boards form corresponding arrangements with a similar geometry.

Figure 2:
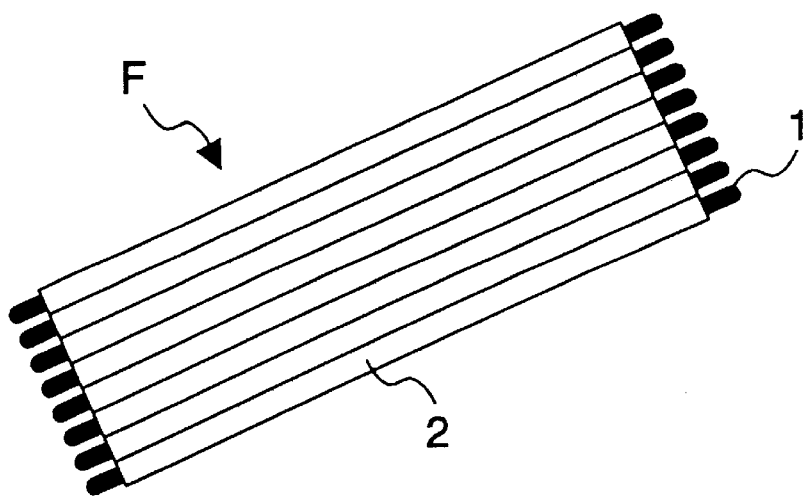
FIG. 2 is a schematic plan view of an embodiment of a flat strip cable.

FIG. 2 is a view of part of an embodiment of a flat strip cable. The cores of the flat strip cable F are enveloped by an electrically insulating protective coating 2, the ends of the cable are free and form pluggable or solderable leads 1. The protective coating 2 can be electromagnetically shielded, so as to permit in troublefree manner high frequency applications.

Figure 3:
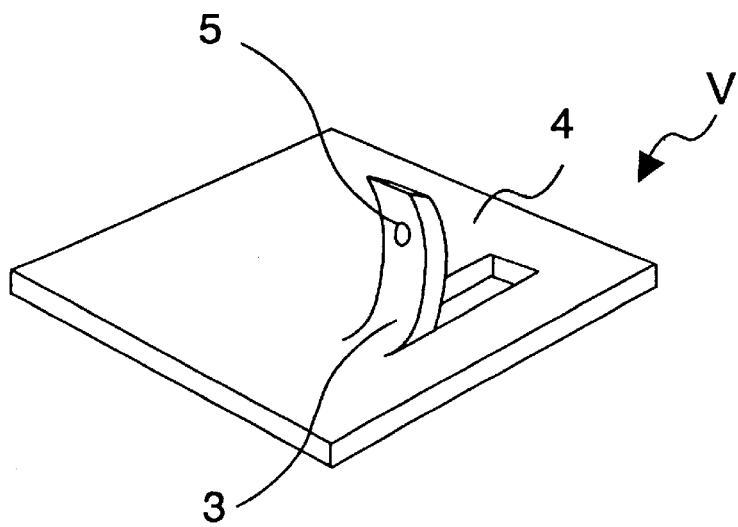
FIG. 3 is a perspective view of part of a first embodiment of a connecting means in the form of a flexible lead.

FIG. 3 perspectively shows part of a first embodiment of a connecting means V in the form of a single, flexible lead 3 manufactured in the method according to the invention. As will be described in greater detail hereinafter, such flexible leads 3 can be produced in insulating layers or substrates 4, in that such insulating layers 4 are etched through by plasma etching at the position of the subsequent borders or edges of the flexible lead 3. The lead 3 in the embodiment of FIG. 3 is rectangular and was virtually cut out by through etching of three interconnected sides of a rectangle from the insulating layer 4. However, it is firmly connected to the substrate 4 by the fourth rectangle side. The etching process speed is dependent on the thickness of the insulating layer 4 and when the layers 4 are in the form of thin polyimide films with a thickness of 25 to 50 μu can be a few minutes. The flexibility of such leads 3 is dependent on the inherent rigidity of the insulating material used and further method steps such as metallization. As a function of the degree of the flexibility, the lead 3 can be prebent by suitable instruments and can be bent out of the plane of the flat substrate 4, so that subsequently it remains in this preshaped orientation for further uses in subsequent method steps. The lead 3 has at its front end a plasma-etched through hole 5 by means of which it can be mechanically fixed to matching connecting means V, such as e.g. a pin. If the lead 3 is provided with current paths, it can also be plugged or permanently connected via the through hole 5 as an electrical or electronic conductor.

Figure 4:
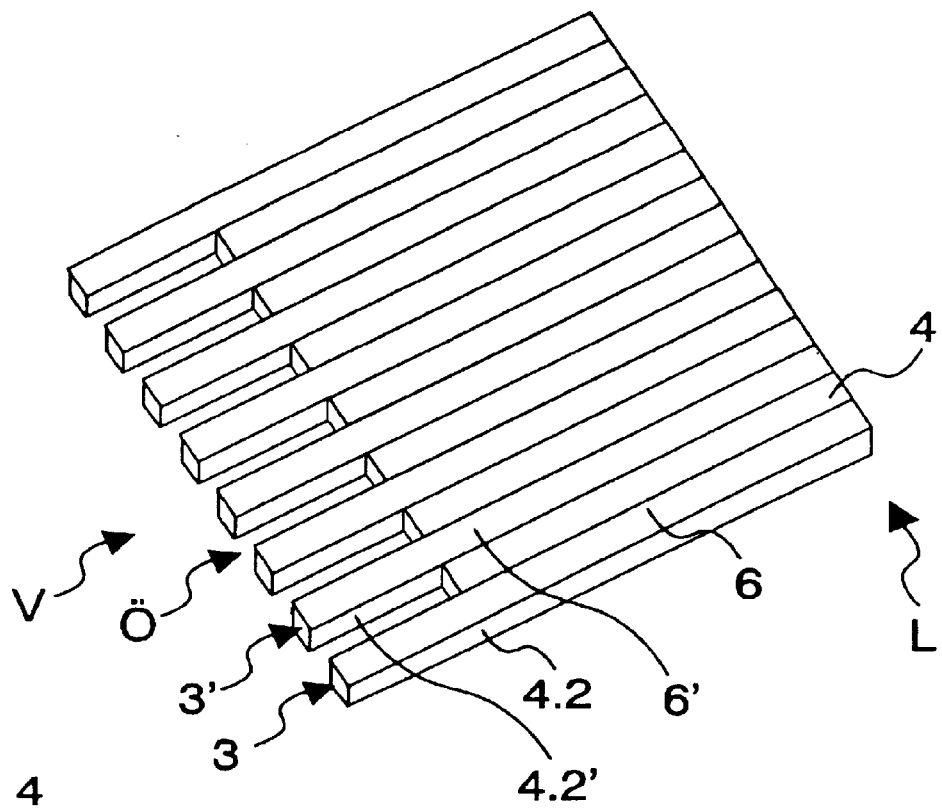
FIG. 4 is a perspective view of part of a second embodiment of a connecting means in the form of an array of contactable leads.

FIG. 4 perspectively shows part of a second embodiment of a connecting means V in the form of an array of contactable leads produced in the method according to the invention. In this embodiment on an outer boundary of a substrate 4 of printed and foil circuit boards, a regular array of openings Ö in the form of small rectangular notches undergo removal by plasma etching. The substrate ends 4.2, 4.2' projecting laterally between these openings Ö are formed with led-up current paths 6, 6' and form leads 3, 3'. Said current paths 6, 6' are not mechanically reinforced or modified with regards to their spatial extension in the vicinity of the shaping out of the leads 3, 3'. The leads 3, 3' are connected at their one end firmly to the substrate 4 and are otherwise free and form pluggable or solderable connecting means V with suitably formed holes or soldering pads of printed and foil circuit boards. As will be shown in greater detail hereinafter, the manufacture of the leads 3, 3' takes place simultaneously and in the same method step as the photochemical structuring of all the current paths 6, 6' of the foil or printed circuit boards. In order to obtain an advantageous, very dense, surface-covering conductor pattern L, the current paths, 3, 3' are so incorporated into the circuit design, that they can be produced simultaneously or in the same method and using the same or similar masks.

Figure 5:
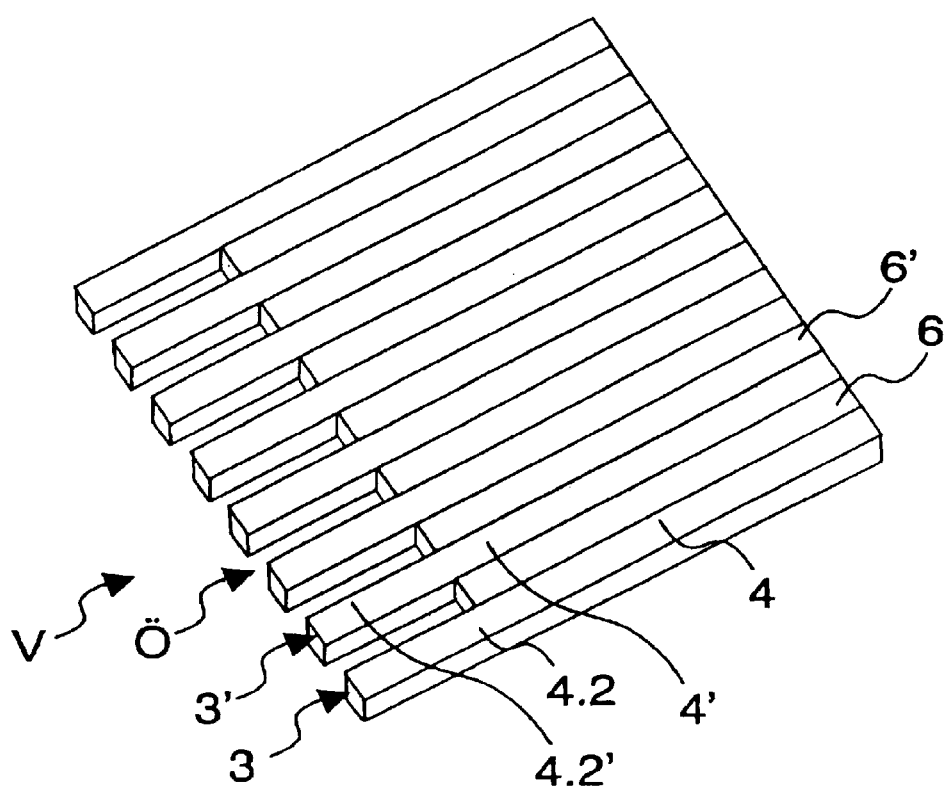
FIG. 5 is a perspective view of part of a third embodiment of a connecting means in the form of an array of contactable leads.

FIG. 5 perspectively shows part of a third embodiment of a connecting means V in the form of an array of contactable leads produced by the inventive method. This embodiment is largely identical to that of FIG. 4, with the exception that the current paths 6, 6' do not now extend up to the projecting substrate ends 4.2, 4.2' and also do not run in their extension axis, but instead in the extension axis of the openings Ö and are worked so as to abut with the latter.

In FIGS. 6 to 16 is shown a first variant of the inventive method of photochemically structuring connecting means V such as connecting openings 11, 11' with led-up current paths 6, 6' by sections of a part of a preliminary product of printed and foil circuit boards. Starting off with such a three-layer foil as an intermediate product with two layers of electrically conductive coatings (metal coatings) 7, 8 and an insulating layer or substrate 4, in a photochemical process the structuring or layout of the circuit and the openings O with led-up current paths 6, 6' takes place. It is also possible to use thin, multilayer plates as preliminary products and also three and multiple-layer printed and foil circuit boards and semifinished products for the production thereof can be used. The preliminary products can be flexible.

Figure 6:
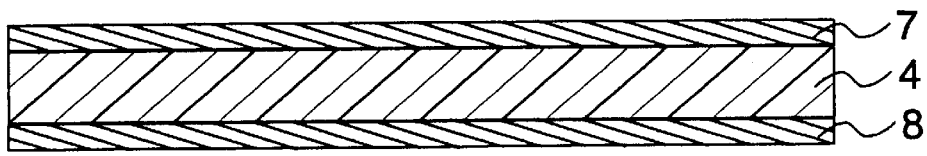
FIGS. 6–16 are schematic sectional views sequentially showing a structure being formed in accordance with a first embodiment of the method according to the invention for the photochemical structuring of connecting means such as connection openings with current paths led up to them.

FIG. 6 shows part of a thin, three-layer foil, where two electrically conductive coatings or metal coatings 7, 8 are separately from one another by an electrically insulating coating 4. Advantageously use is made of thin metal/ insulating layers or coatings in the form of 25 to 50 μm thick copper and polyimide or epoxy films.

Figure 7:
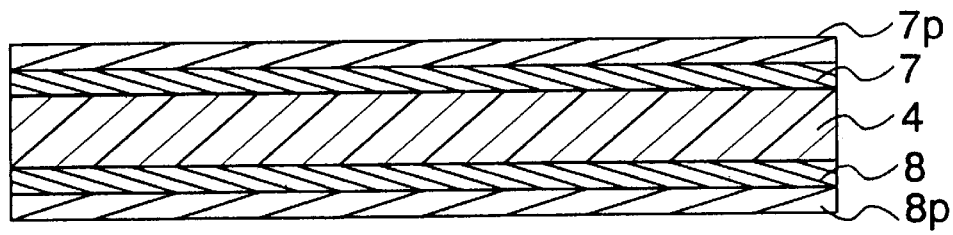

FIG. 7 shows the preliminary product after the application of two photoresist coatings 7p, 8p to the conductive coatings 7, 8, so that the latter are completely photoresist-covered. Solid or liquid photoresist can be used. The photoresist coatings 7p, 8p can be exposed in known photochemical processes and can consequently in this way transfer a circuit and connecting means design by means of photomasks. The circuit design contains the position and structure of the to be produced conducting paths or current paths and insulating areas in the metal coatings 7, 8. The connecting means design contains the position and structure of the connecting means V to be produced. These designs such as the circuit and connecting means design are matched to one another and supplement one another. In this first variant of the method according to the invention in the first layout according to FIGS. 6 to 11 only the connecting means are implemented, whereas the current paths are formed in a second layout according to FIGS. 11 to 15.

Figure 8:
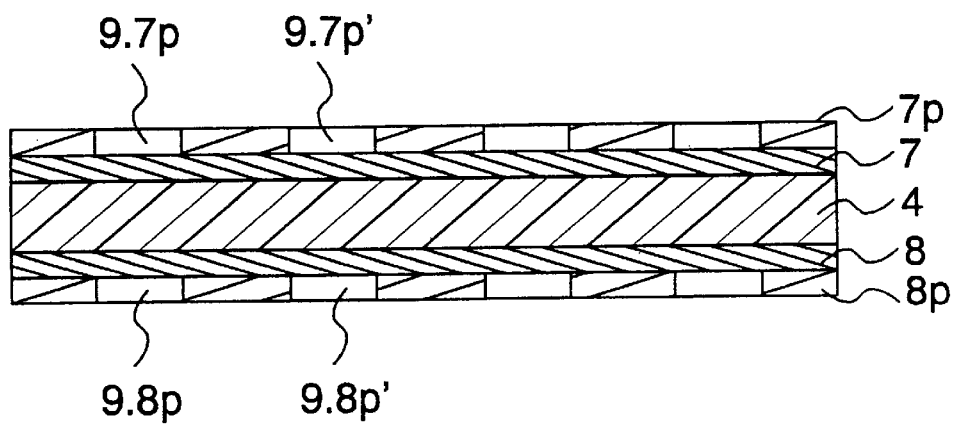

FIG. 8 shows the photochemically performed structuring of the photoresist coatings 7p, 8p in accordance with the connecting means and circuit designs. In the structured photoresist coatings 7p, 8p are formed connecting means structures 9.7p, 9.7p' and 9.8p, 9.8p', which extend down to the metallic coatings 7, 8. The other, photoresist-covered areas of the metal coatings 7, 8 are circuit structures, which are protected against wet chemical etching in further process steps of following photochemical working. The surface size of the connecting means structures is in the millimeter range and this forms the order of magnitude of the connecting openings to be produced. It is technically possible to produce much smaller structures of approximately 25 to 100 µm. The shapes of the surfaces are freely selectable and can be in the form of circular cylindrical, round, oval, square, rectangular and polygonal surfaces.

Figure 9:
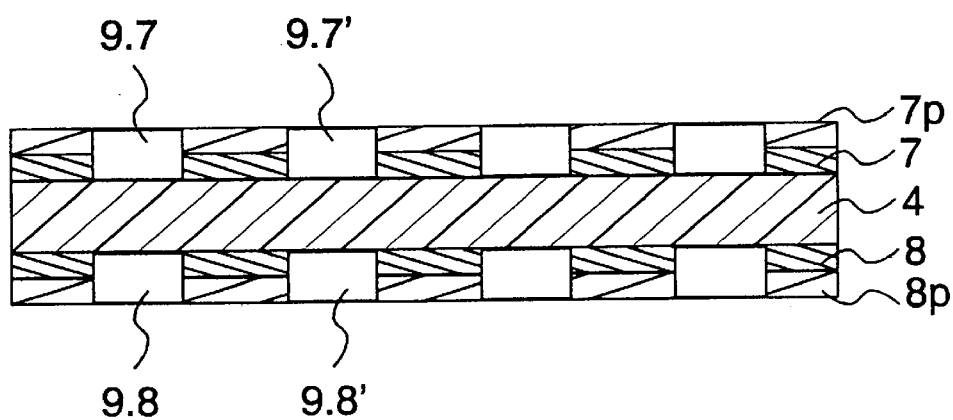

FIG. 9 shows the metal coatings 7, 8 covered with photochemically structured photoresist coatings 7p, 8p after the wet chemical etching of the photoresist-uncovered metal of the metal coatings 7, 8. This etching takes place according to the connecting means design only in the vicinity of the connecting means structures 9.7p, 9.7p' and 98p, 9.8p' and leads to the planned formation of connecting means mouths 9.7, 9.7' and 9.8, 8.8', which extend down to the insulating layer 4. It is pointed out that this wet chemical etching generally takes place by pressing on reusable stencils or masks e.g. formed from high-grade steel foils. Such stencils are not attacked by the etching medium, which can only pass up to the metal coatings 7, 8 to be etched in the areas of the openings in said stencils.

Figure 10:
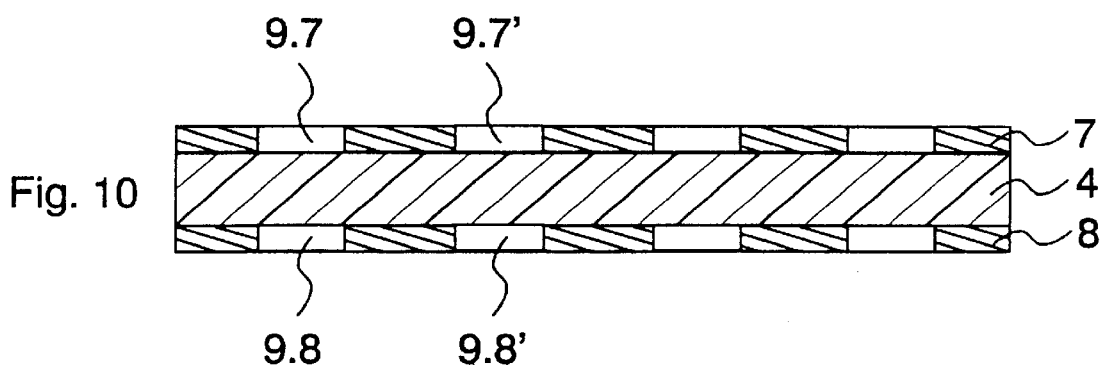

FIG. 10 shows the preliminary product in the manufacturing stage according to FIG. 9 after removing the photoresist coatings 7p, 8p by means of known, proven chemical processes. This method step is optional because, as a function of the nature and duration of the plasma etching, the photoresist is removed to a greater or lesser extent during plasma etching through the uncovered insulating layer 4.

Figure 11:
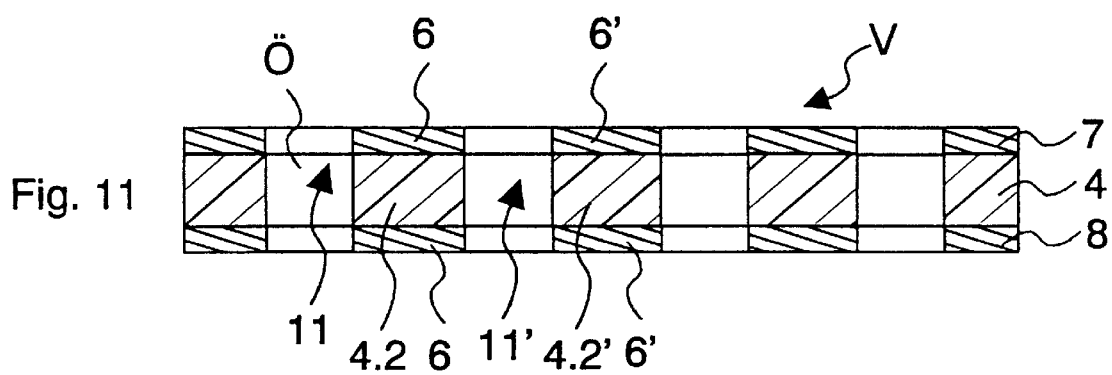

FIG. 11 shows the preliminary product cleaned from photoresist according to FIG. 10 following the plasma etching of connections between the connecting means mouths 9.7, 9.7' and 9.8, 9.8' through the insulating layer 4. Through said connections the connecting means mouths 9.7, 9.7' and 9.8, 9.8' of the two metal coatings 7, 8 are interconnected. Thus they form connecting means V in the form of connecting openings 11, 11' with current paths 6, 6' led up to the openings Ö. The current paths 6, 6' are led up to the plasma etching-structured substrate ends 4.2, 4.2'.

Figure 12:
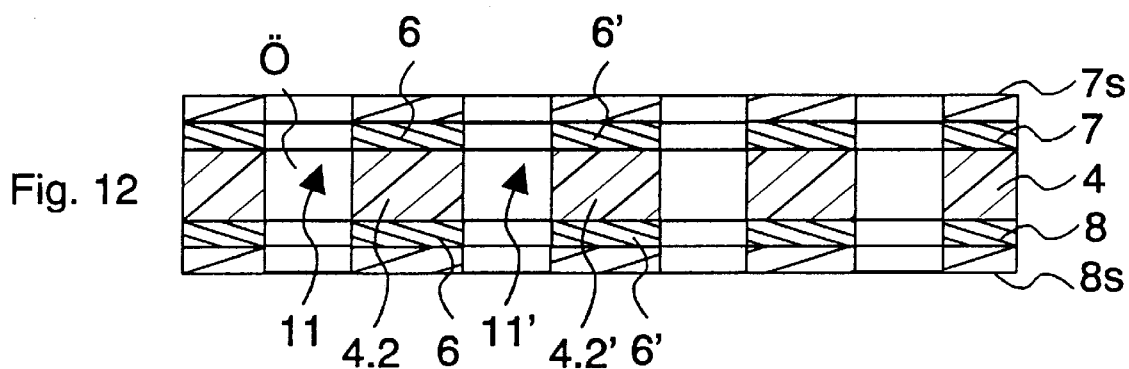

FIG. 12 shows the preliminary product following the application of two further photoresist coatings 7s, 8s to the conductive layers 7, 8 provided with openings O. The metal coatings 7, 8 can be covered with solid or liquid photoresist 7s, 8s and exposed in known photochemical processes, so as to transfer the current path design via photomasks. This current path design contains the position and structure of further current paths to be produced and insulating areas in the metal coatings 7, 8.

Figure 13:
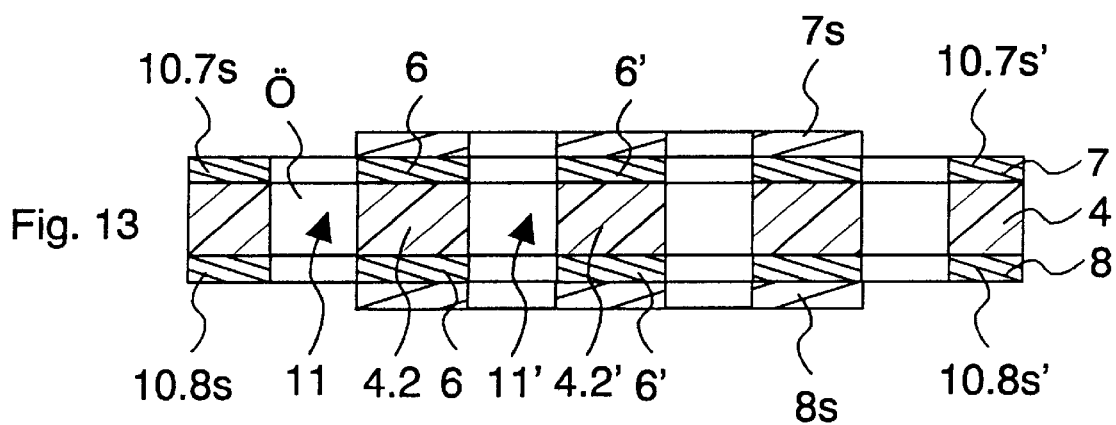

FIG. 13 shows the photochemical structuring of the photoresist coatings 7s, 8s in accordance with the current path design. In the structured photoresist coatings 7s, 8s are formed insulating structures 10.7s, 10.7s' and 10.8s, 10.8s', which extend down to the metal coatings 7, 8. The remaining, photoresist-covered areas of the metal coatings 7, 8 are current path structures, which are protected against wet chemical etching during photochemical working in further method steps.

Figure 14:
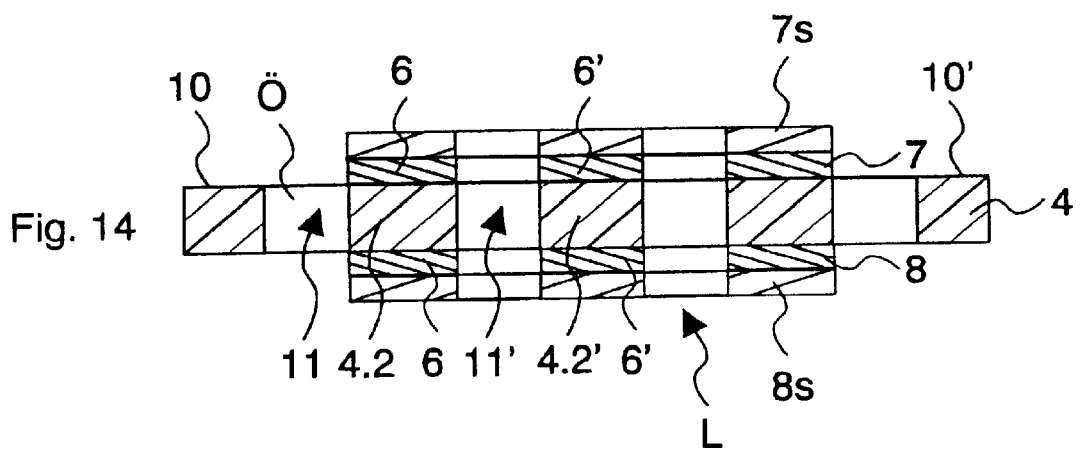

FIG. 14 shows the metal coatings 7, 8 covered with photochemically structured photoresist coatings 7s, 8s following the wet chemical etching of the photoresist-uncovered metal of the metal coatings 7, 8. This etching takes place according to the current path design only in the area of the photoresist-uncovered insulating structures 10.7s, 10.7s' and 10.8s, 10.8s' and leads to the planned formation of electrically nonconductive areas, which are referred to as insulating areas 10, 10' and leads to the formation of electrically conductive areas, known as current paths 6, 6'. The insulating areas 10, 10' and current paths 6, 6' are parts of the circuit/conductor pattern obtained and provide the mutual insulation of the current paths 6, 6' running in the structured, conductive coatings 7, 8.

Figure 15:
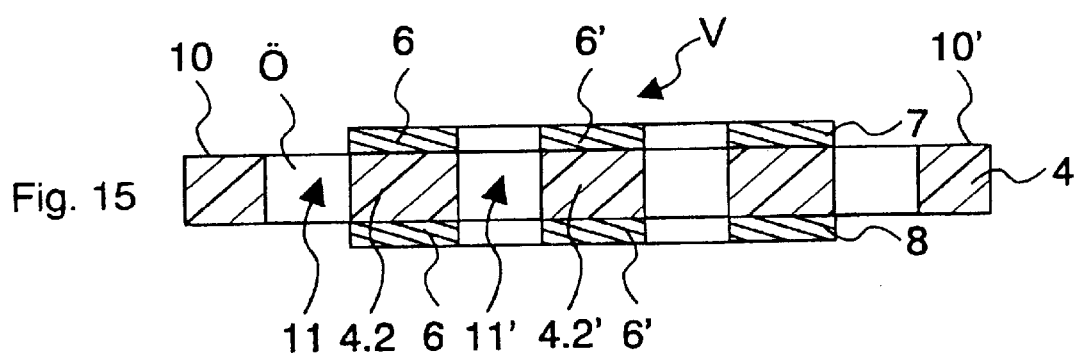

FIG. 15 shows the preliminary product in the manufacturing stage according to FIG. 14 after removing the remaining photoresist coatings 7s, 8s, using known, proven chemical processes. The first variant of the inventive method for the production of printed and foil circuit boards and semifinished products for printed and foil circuit boards from the preliminary product according to FIG. 6 with a fourth embodiment of a connecting means V in the form of connecting openings 11, 11' with current paths 6, 6' led up to substrate ends 4.2, 4.2' is consequently concluded.

Figure 16:
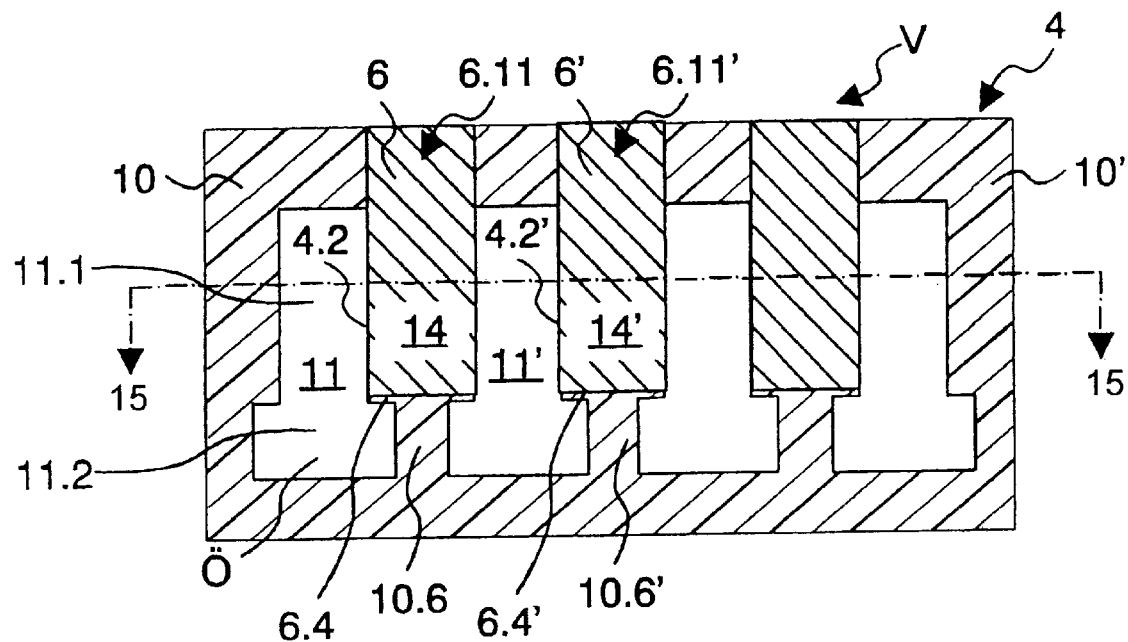

FIG. 16 is a plan view of part of a printed or foil circuit board, whose section 15—15 corresponds to the cross-sectional view of FIG. 15. The openings Ö and current paths 6, 6' are separated from one another by the substrate 4 are supported mechanically and electrically mutually insulated. The openings Ö are identically formed and are parallel to one another. They have an elongated structure and in the represented embodiment ends of different widths. According to the invention the printed or foil circuit board can also be bounded at the line 15—15.

The current paths 6, 6' led up to or linked with the connecting openings 11, 11' are equally long and parallel. They are led by means of supply lines 6.11, 6.11' to substrate ends or webs 4.2, 4.2'. On said substrate ends 4.2, 4.2' they only run on one surface between the connecting openings 11, 11'. If the printed or foil circuit board does not end along the line 15—15, then the substrate ends 4.2, 4.2' are fixed to the substrate 4 on two sides, on one by means of supply lines 6.11, 6.11' and on the other via the electrically insulating terminating areas 6.4, 6.4' and electrically insulating connecting areas 10.6, 10.6'. However, if the foil or printed circuit board ends along the line 15—15, then the substrate ends 4.2, 4.2' are only firmly connected to the substrate 4 on one side, namely by means of the supply line 6.11, 6.11'.

The functions of the insulating areas 10.6, 10.6' at the ends of the current paths 6, 6' will be described in detail hereinafter. Thus, the terminating areas 6.4, 6.4' allow a controlled electrical contacting or assembly of the printed or foil circuit boards. The connecting areas 10.6, 10.6' allow a partial, one-sided release of the substrate ends 4.2, 4.2' from the substrate 4 by separating or cutting through of the deliberately narrowly worked connecting areas 10.6, 10.6'. Following this partial release the substrate ends 4.2, 4.2' only have connections to the printed or foil circuit board by the supply lines 6.11, 6.11' and can therefore be spatially oriented, e.g. prebent into a specific, desired position, etc.

Figure 17:
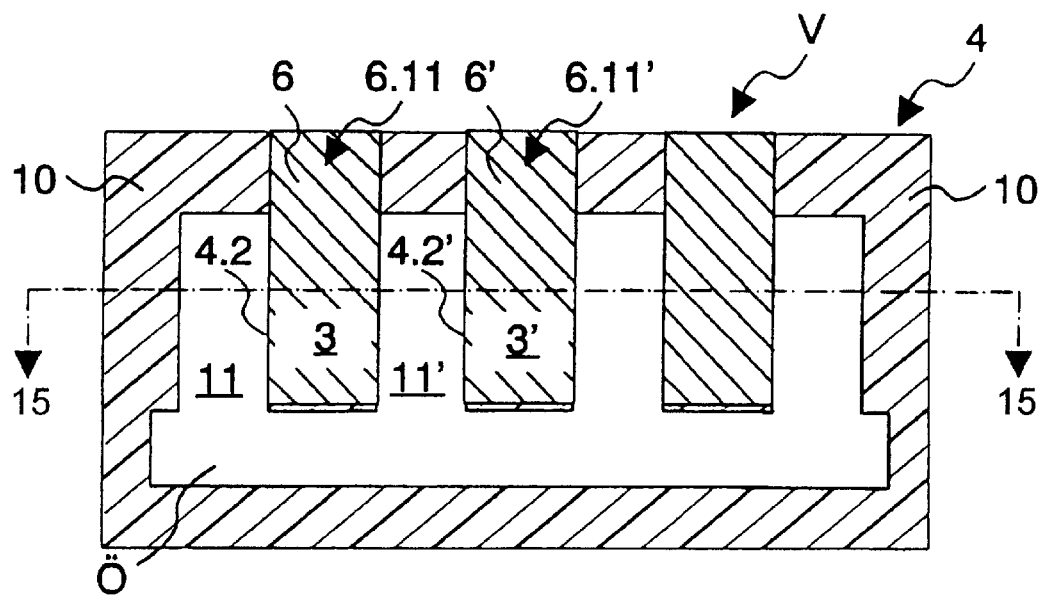
FIG. 17 is a schematic plan view, taken in conjunction with FIGS. 6–16, of a second embodiment of the method of the invention for the photochemical structuring of connecting means such as leads.

In FIG. 17 is described a second variant of the inventive method for the photochemical structuring of connecting means V by sections of part of printed or foil circuit boards. This second variant is based on sections of the first variant according to FIGS. 6 to 16, in that a preliminary product according to FIG. 6 is further worked, a manufacturing stage according to FIGS. 15 and 16 and then undergoes a release process described hereinafter. In the second variant of the method, the second embodiment of connecting means V is produced in the form of contactable leads according to FIG. 4.

FIG. 17 is a plan view of part of a printed or foil circuit board, whose section 15—15 15—15 corresponds to the cross-sectional view of FIG. 15. For producing the second embodiment of a connecting means V, the openings Ö must be made on the outer boundaries of a printed or foil circuit board, so as to form the openings Ö according to FIG. 4. This is the case if the part of the printed or foil circuit board according to FIGS. 15 and 16 is to be laterally bounded in the connecting areas 10.6, 10.6'. This can take place in that at the ends of the current paths 6, 6', the substrate ends, 4.2, 4.2' are bounded along the line 15—15 according to FIG. 17, i.e. here the edge of the three-layer foil of the preliminary product according to FIG. 6 is located, or it is possible for part of a printed or foil circuit board to be separated or cut out in the connecting areas 10.6, 10.6' according to FIG. 16.

By bounding along line 15—15 or following release leads 3, 3' are formed, which are only connected to the substrate 4 by supply lines 6,11, 6.11'. As a function of their length and material-specific flexibility the leads 3, 3' can be prebent by corresponding instruments and be bent out of the plane of the flat substrate 4, so as to then remain in this preshaped orientation. However, these leads 3, 3' can also be very long and flexible, e.g. they can be as wide or long as the printed or foil circuit boards in which they are structured, so that following their release they are also contactable with further removed connecting means V of the same printed or foil circuit board or other circuit carriers located in this length area.

Thus, it is e.g. possible to fit or insert an array of sufficiently long leads 3, 3' according to FIGS. 14 and 17 in connecting openings 11, 11' according to FIG. 16. Such leads are e.g. inserted in the wide, short elements 11.2, 11.2' of the connecting openings 11, 11' and are mechanically held therein. The small rectangular openings 0 between the individual leads 3, 3' are then located on insulating connecting areas 10.6, 10.6' of the printed or foil circuit board. Thus, the leads 3, 3' abut at right angles on the linked up current paths 6, 6' of the connecting openings 11, 11' and are electrically contactable. As a function of the width of the terminating areas 6.4, 6.4' of the current paths 6, 6' and the openings Ö the latter directly form by engagement electrical contact, or they are electrically interconnected during subsequent operations by soldering. This can be desirable so that e.g. circuit carriers to be assembled and in this case the leads 3, 3' are initially mechanically fitted and positioned and then produce electrical contacts by soldering.

FIGS. 18 to 23 illustrate a third variant of the inventive method for the photochemical structuring of connecting means V such as leads 3, 3' by sections of a part of printed or foil circuit boards. This third variant is based on the first variant of the method according to FIGS. 6 to 16, in that a preliminary product according to FIG. 6 is further processed to a production stage according to FIGS. 15 and 16 and then undergoes a subsequently described through-plating process.

Figure 18:
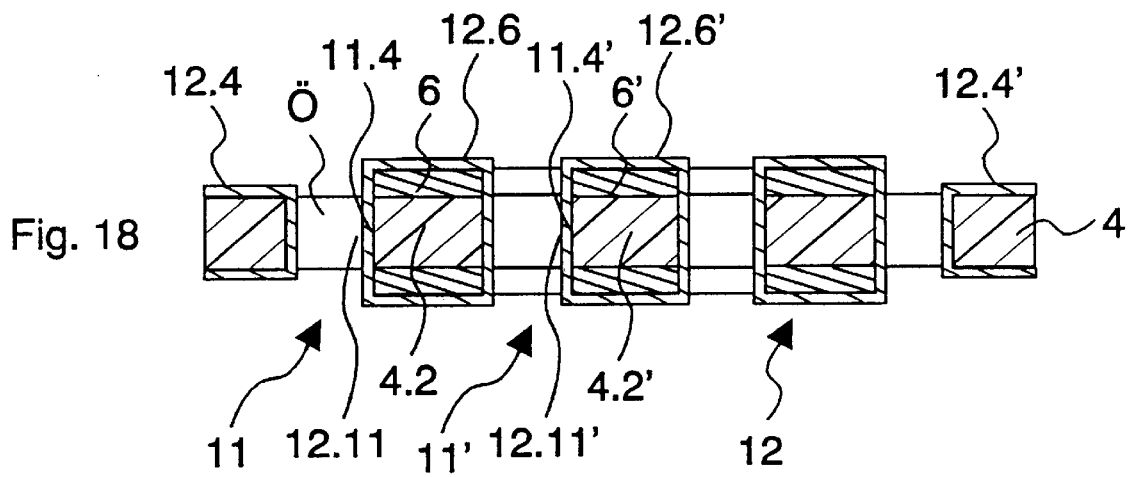
FIGS. 18–23 is a schematic plan view taken in conjunction with FIGS. 6–16, of a third embodiment of the method according to the invention for the photochemical structuring of connecting means such as connecting openings with current paths led up to them.

FIG. 18 shows the preliminary product in the manufacturing stage according to FIG. 15 after plating on an electrically conductive coating or metal coating 12 using known, proven chemical methods, e.g. electrodeposition of copper. The metal coating 12 completely surrounds the preliminary product, i.e. it covers the current paths 6, 6', the inner faces 11.4, 11.4' of the connecting openings 11, 11' and the insulating layer 4 with an electrically conductive copper layer. On the inner faces of the connecting openings 11, 11' this is referred to as the metal coating 12.11, 12.11'. On the current paths 6, 6' it is referred to as the metal coating 12.6, 12.6'. On the insulating layer 4 it is called metal coating 12.4, 12.4'. These metal coatings 12.11, 12.11' and 12.6, 12.6' are Pointlessly connected. The plated-on, conductive coating 12 produces in the state according to FIG. 18 short-circuit between the current paths 6, 6' and is subsequently photochemically structured using a plating-on design.

Figure 19:
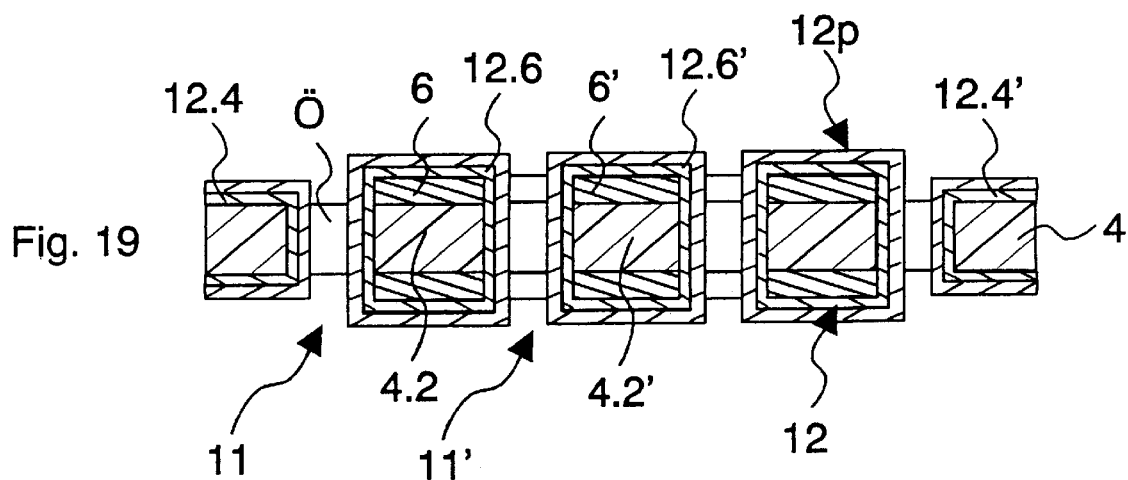

FIG. 19 shows the plated-on preliminary product according to FIG. 18 following the application of a photoresist coating 12p to the plated-on, conductive coating 12. For this purpose use is advantageously made of liquid photoresist 12p. The plated-on inner faces of the connecting openings 11, 11p are also covered with photoresist 12p. The photoresist 12p is photochemically exposed and thus transfers the plating-on design by means of photomasks. The plating-on design contains the position and structure of the current paths to be produced and insulating areas in the metal coating 12. The plating-on design is an extension or addition of the circuit design and the connecting means design.

Figure 20:
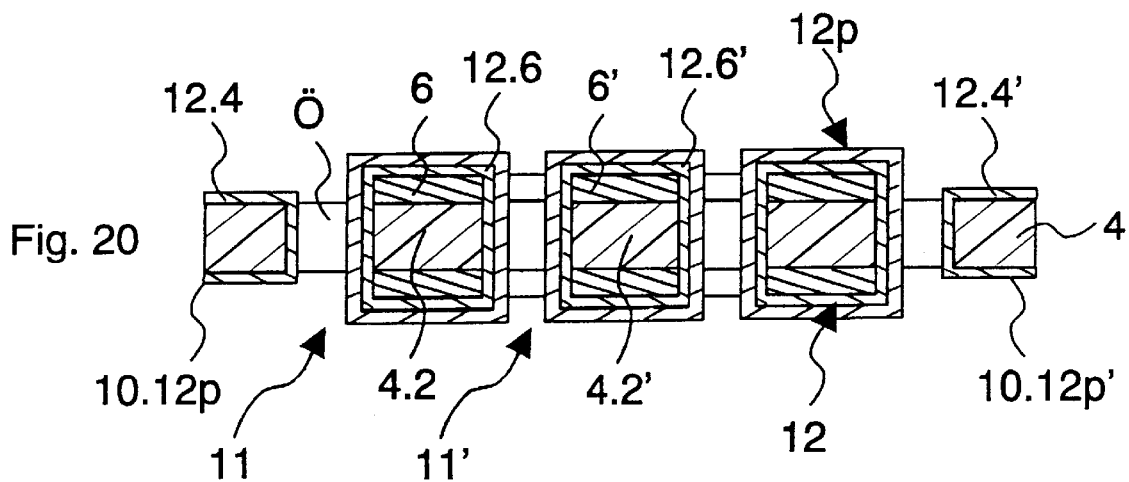

FIG. 20 shows the structuring of the photoresist coating 12p photochemically performed according to the plating-on design. In the structured photoresist coating 12p are formed insulating structures 10.12p, 10.12p', which extend down to the metal coating 12. The photoresist-covered areas of the metal coating 12 are protected against wet chemical etching by this photoresist during the following photochemical treatment.

Figure 21:
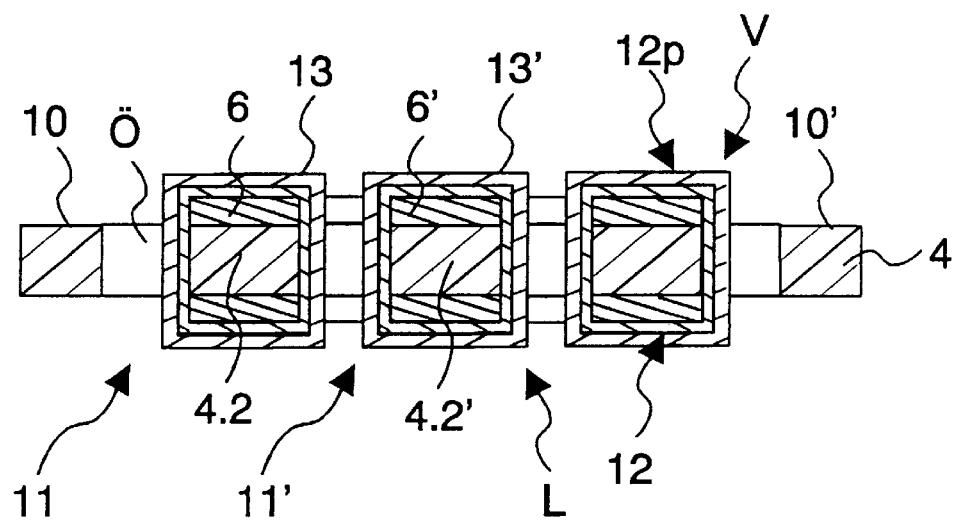

FIG. 21 shows a metal coating 12 covered with a photochemically structured photoresist coating 12p following the wet chemical etching of the photoresist-uncovered metal of the metal coating 12. This etching takes place in accordance with the plating-on design only in the area of the photoresist-uncovered insulating structures 10.12p, 10.12p' and leads to the planned formation of electrically nonconductive areas, called insulating areas 10, 10' and to the formation of electrically conductive area, referred to as plated-on, widened current paths 13, 13'. The insulating areas 10, 10' and the current paths 13, 13' widened by plating on are parts of the circuit obtained or conductor pattern L and bring about the mutual insulating of the widened current paths 13, 13'. In the present embodiment the widened current paths 13, 13' produced from the subsequently plated-on metal coating 12 and the current paths 6, 6' produced from the original metal coatings 7, 8 coincide, but this need not be the case. The plated-on, widened current paths 13, 13' can run in accordance with an independent circuit design in the same way as the original current paths 6, 6'. For example, they can be in the form of mutually electrically insulated inner face current paths in openings and through holes, such as the connecting openings 11, 11'. Such openings to be photochemically structured must have minimum diameters and maximum depths and favourable length ratios of minimum diameter to maximum depth of approximately 1:1. A corresponding invention has been disclosed by the same applicant in Swiss patent application 13081936.

The reinforcement of the current paths 6, 6' in widened current paths 13, 13' performed by this plating on is consequently not carried out for assembly reasons, because according to the plating-on design said reinforcement takes place in all the printed or foil circuit board areas, i.e. also in those located outside the area of the connecting means V. In fact the plating on serves to bring about an optimum structuring or layout of the conductor pattern L, leads to a greater design freedom for the connecting means V and allows in this case a not shown, but possible structuring of all the surfaces of substrate ends 4.2, 4.2' in current paths.

Figure 22:
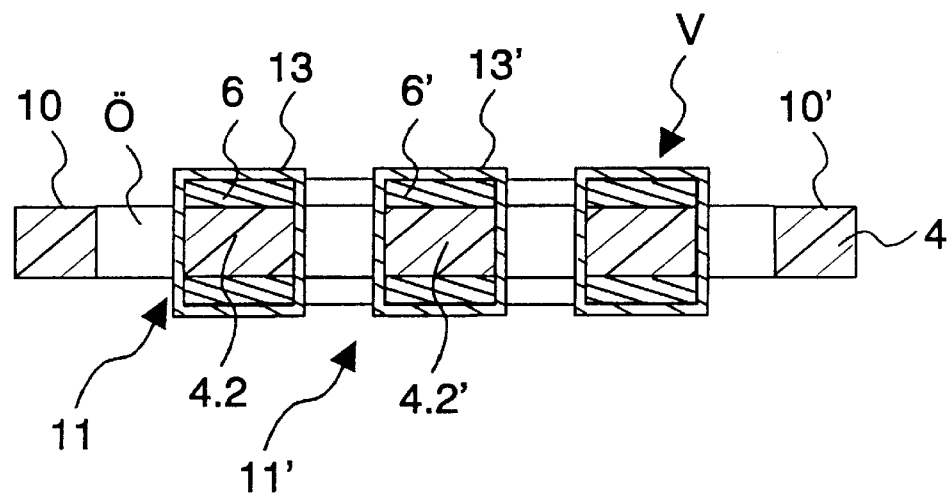

FIG. 22 shows the preliminary product in the manufacturing stage according to FIG. 21 after removing the remaining photoresist coating 12p and using known, proven chemical processes. The third variant of the inventive method for the manufacture of printed and foil circuit boards and semifinished products for printed and foil circuit boards from the preliminary product according to FIG. 6 is consequently at an end.

Figure 23:
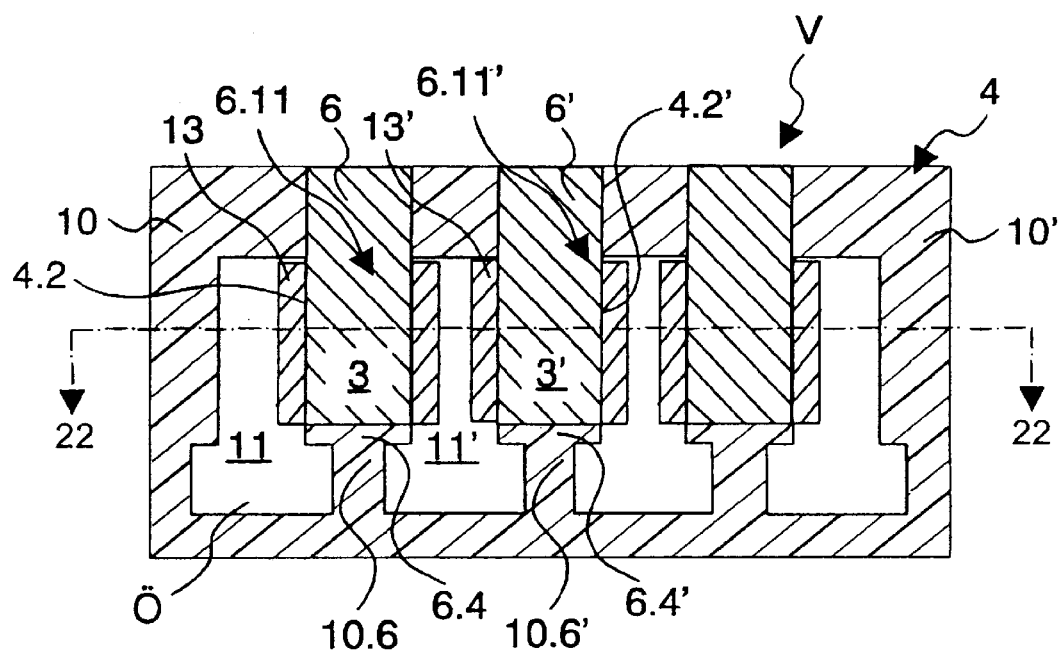

FIG. 23 shows a plan view of part of a printed or foil circuit board, whose section 22—22 corresponds to the cross-sectional view of FIG. 22. The openings Ö and widened current paths 13, 13' are separated from one another by the substrate 4, carried mechanically and mutually electrically insulated. The current paths 13, 13' are insulated from one another on the surface by insulating areas 10, 10'. In analogy to the fourth embodiment of a connecting means V according to FIGS. 15 and 16, to the ends of the linked up current paths 13, 13' are fitted terminating areas 6.4, 6.4' and connecting areas 10.6, 10.6'. However, as a difference therefrom, the current paths 13, 13' led up to the openings Ö are now no longer only worked on one of the surfaces of She substrate ends 4.2, 4.2' mechanically carrying them, but instead said ends 4.2, 4.2' are now covered all round with a closed, plated-on, electrically conductive coating. These connecting openings 11, 11' provided with all-around, plated-on, linked up current paths 13, 13' represent a fifth embodiment of inventively produced connecting means V. According to the invention the printed or foil circuit board can also be bounded at the line 22—22, so that connecting means V are produced in the form of all-around, plated-on, contactable leads.

Figure 24:
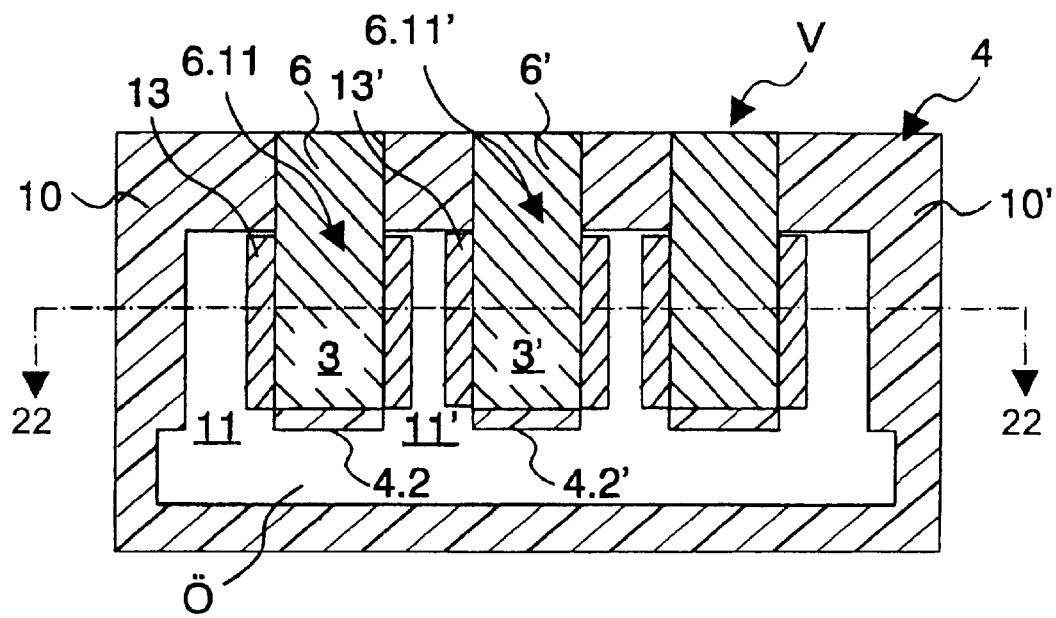
FIG. 24 is a schematic plan view, taken in conjunction with FIGS. 6–16, of a fourth embodiment of the inventive method of photochemically structuring connecting means such as leads.

FIG. 24 illustrates a fourth variant of the inventive method of photochemically structuring connecting means V by sections of part of printed or foil circuit boards. This fourth variant is based on steps of the first and third variants of the method according to FIGS. 6 to 16 or 18 to 23, in that a preliminary product according to FIG. 6 is further processed in a manufacturing stage according to FIGS. 22 and 23 and then undergoes a subsequently described release process. A sixth embodiment of connecting means V in the form of all-round, plated-on, contactable leads 3, 3' is implemented. FIG. 24 consequently shows a plan view of part of a printed or foil circuit board, whose section 22—22 corresponds to the cross-sectional view according to FIG. 22. In analogy to the second variant of the method according to FIG. 17, the connecting openings 11, 11' are separated or cut through in the connecting areas 10.6, 10.6' according to FIG. 23, so that all-round, plated-on, contactable leads 3, 3' are obtained, which are firmly, partially connected to the substrate 4 solely by means of the supply lines 6.11, 6.11'. The closed worked, electrically conductive coatings 13, 13' have the advantage compared with the conductive coatings 6, 6' worked on both sides (top and bottom) according to FIGS. 15 and 16 of higher mechanical stiffness. The stiffer current paths 13, 13' can be better spatially oriented and maintain a specific, selected, spatial orientation, e.g. a bending to a certain angle.

In FIGS. 25 to 32 are illustrated a fifth variant of the inventive method of the photochemical structuring of connecting means V, such as a shielded cable 15, by sections of part of a printed or foil circuit board. Starting from a three-layer foil as a preliminary product with two outer layers in the form of electrically conductive coatings (metal coatings), an insulating layer or substrate and a current path completely embedded in the latter, in a photochemical process is carried out the structuring of the circuit and that of the insulating openings with plated-on shields. This fifth method variant takes place in analogy to the first and third method variants.

Figure 25:
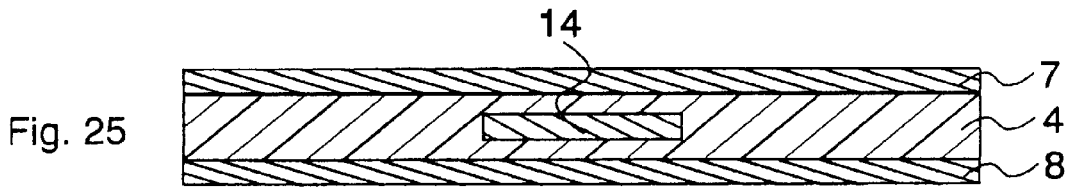
FIGS. 25–32 are schematic sectional views sequentially showing a structure being formed in accordance with a fifth embodiment of the inventive method of photochemically structuring connecting means such as a shielded cable.

FIG. 25 shows part of a thin, three-layer foil as a preliminary product, in which two outer, electrically conductive or metal coatings 7, 8 are separated from one another by an insulating layer or substrate 4 and in which a current path as a cable core 14 is completely embedded in the substrate 4. This current path or cable core 14 is advantageously given a uniform thickness over its entire length.

Figure 26:
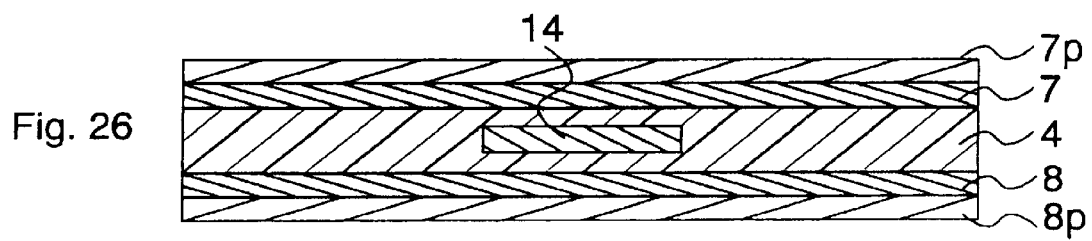

FIG. 26 shows the preliminary product after the application of two photoresist coatings 7p, 8p to the conductive coatings 7, 8, so that the latter are completely coated with photoresist, which can be of a solid or liquid nature. The photoresist coatings 7p, 8p can be exposed using known photochemical processes and can consequently transfer by means of photomasks a circuit and a connecting means design. The circuit design contains the position and structure of the conducting or current paths to be produced and insulating areas in the metal coatings 7, 8. The connecting means design contains the position and structure of the connecting means V to be produced. The circuit and connecting means designs are matched to and supplement one another.

Figure 27:
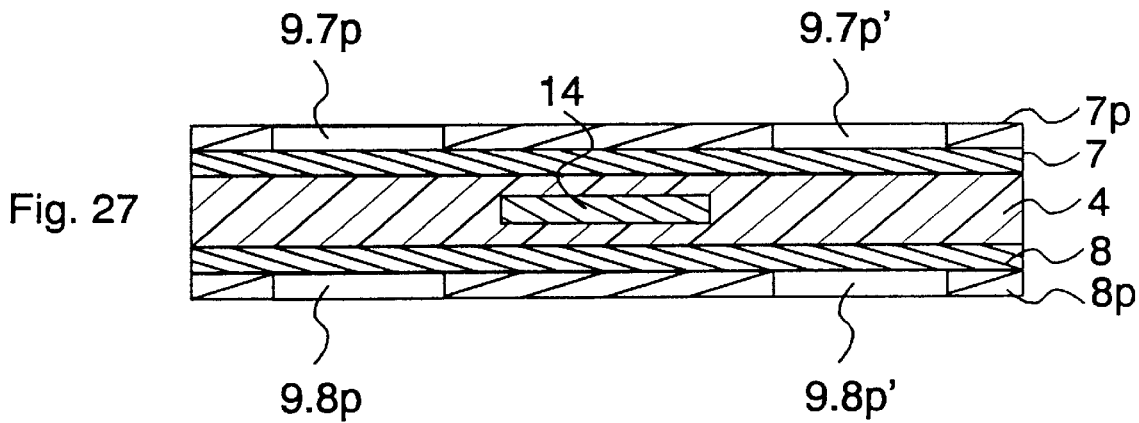

FIG. 27 shows the structuring of the photoresist coatings 7p, 8p performed photochemically according to the connecting means and circuit designs. In the structured photoresist coatings 7p, 8p are formed connecting means structures 9.7p, 9.7p' and 9.8p, 9.8p', which extend down to the metal coatings 7, 8.

Figure 28:
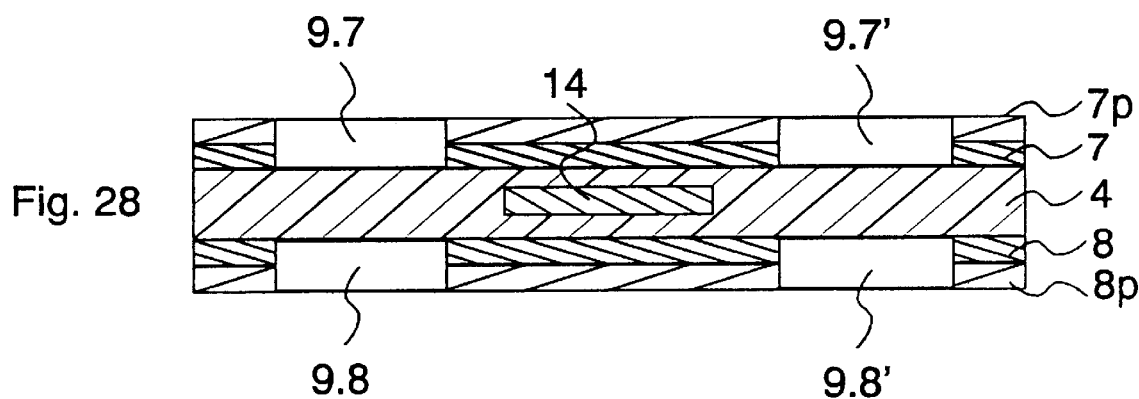

FIG. 28 shows the metal coatings 7, 8 covered with photochemically structured photoresist coatings 7p, 8p following the wet chemical etching of the photoresist-uncovered metal of the metal coatings 7, 8. This etching takes place in accordance with the connecting means design only in the area of the connecting means structures 97p, 9.7p' and 9.8p, 9.8p' and leads to the planned formation of connecting means mouths 9.7, 9.7' and 9.8, 9.8' extending down to the insulating layer 4.

Figure 29:
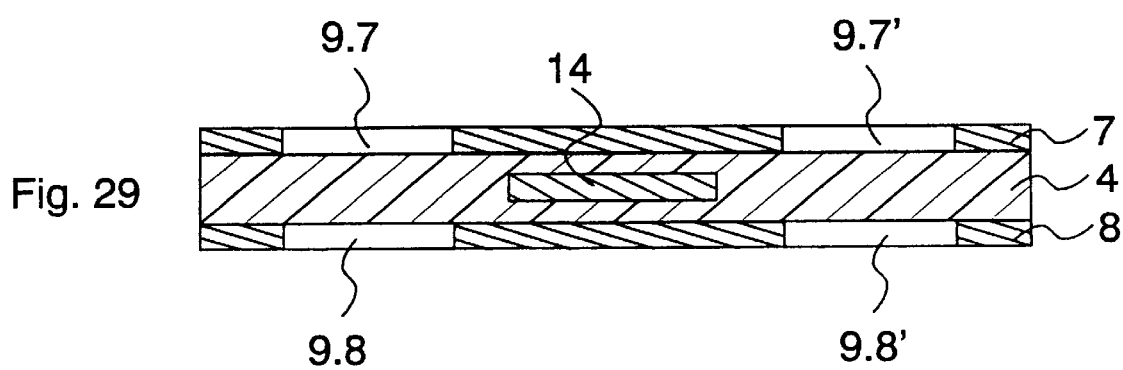

FIG. 29 shows the preliminary product in the manufacturing stage according to FIG. 28 after removing the photoresist coatings 7p and 8p by known, proven chemical processes.

Figure 30:
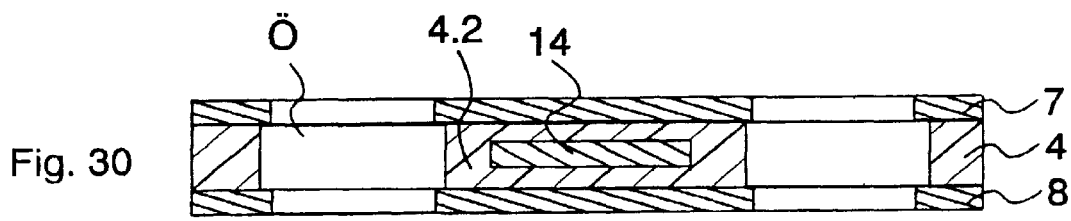

FIG. 30 shows the photoresist-cleaned preliminary product according to FIG. 29 following the plasma etching of connections between the connecting means mouths 9.7, 9.7' and 9.8, 9.8' through the insulating layer 4. These connections interconnect the connecting means mouths 9.7, 9.7' and 9.8, 9.8' of the two metal coatings 7, 8 and thus form openings Ö. The current path 4 consequently runs in the interior of a substrate end 4.2 completely surrounding the same with a uniform thickness.

Figure 31:
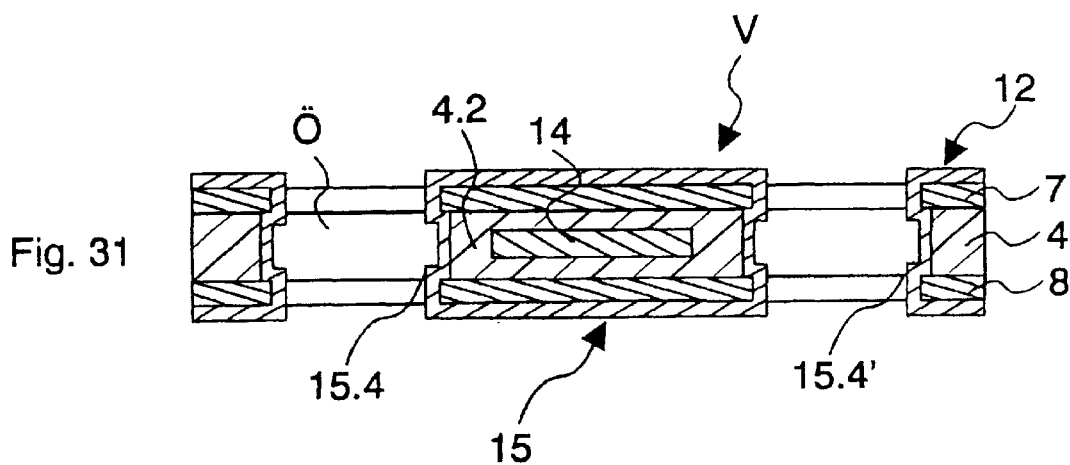

FIG. 31 shows the preliminary product in the manufacturing stage according to FIG. 30 following the plating on of an electrically conductive or metal coating 12 using known, proven chemical methods, e.g. electrodeposition of copper. The metal coating 12 completely surrounds the preliminary product, i.e. it covers the structured metal coatings 7, 8, the inner faces 15.4, 15.4' of the openings Ö and the insulating layer 4 with an electrically conductive copper coating. The cable core 14 completely embedded in the substrate 4 is electromagnetically shielded by the plated-on structure completely surrounding them. This is a seventh embodiment of the connecting means V produced by the inventive method in the form of a shielded cable 15.

Such shielded cables 15 with controlled and uniformly produced thicknesses and lengths of the cable cores 14, the insulating areas and the shield, which are connected on one or both sides (i.e. at the ends) to the substrate 4 and are partly detachable (i.e. releasable at their ends, cf. FIG. 32) and which are spatially orientable as a function of their stiffness and flexibility, are suitable for uses in the transmission of high frequency signals. For assembly reasons there is no need to reinforce or modify with regards to spatial extension the said connecting means V. Such preliminary products in the manufacturing stage according to FIG. 31 are suitable not only as fully shielded cables and can instead naturally be provided with surface current paths, i.e. with current paths 6, 6' in the outer, conductive layers, as in the method steps according to FIGS. 18 to 23. For this purpose the preliminary product must undergo identical method steps.

Figure 32:
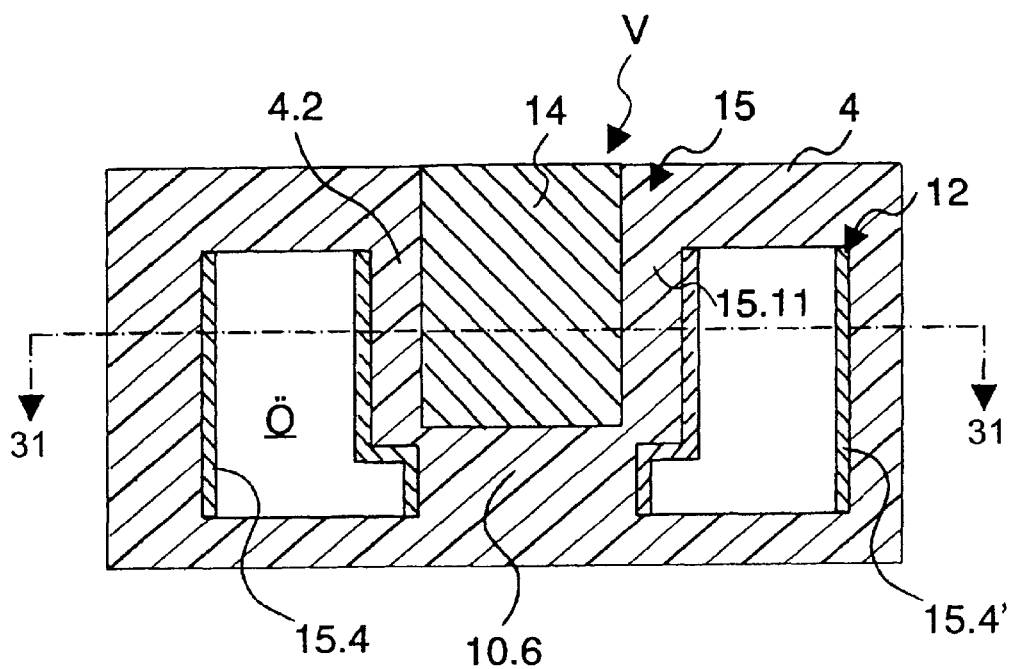

FIG. 32 shows a section of part of a printed or foil circuit board, whose section 31—31 corresponds to the cross-sectional view of FIG. 31. The plated-on metal coating 12 and the inner current path 14 are separated from one another by the substrate end 4.2, are mechanically carried and mutually electrically insulated. In analogy to the fourth embodiment of a connecting means V according to FIGS. 15 and 16 or the fifth embodiment of a connecting means V according to FIGS. 22, 23 and 24, at the end of the linked up current path 14 are fitted connecting areas 10.6, 10.6', where the shielded cable 15 can be cut through or separated on one side and so that the shielded cable 15 is only partially firmly connected to the substrate 4, i.e. solely by means of the supply line 15.11. According to the invention, advantageously the printed or foil circuit board is bounded along the line 31—31, so that leads are formed.

Figure 33:
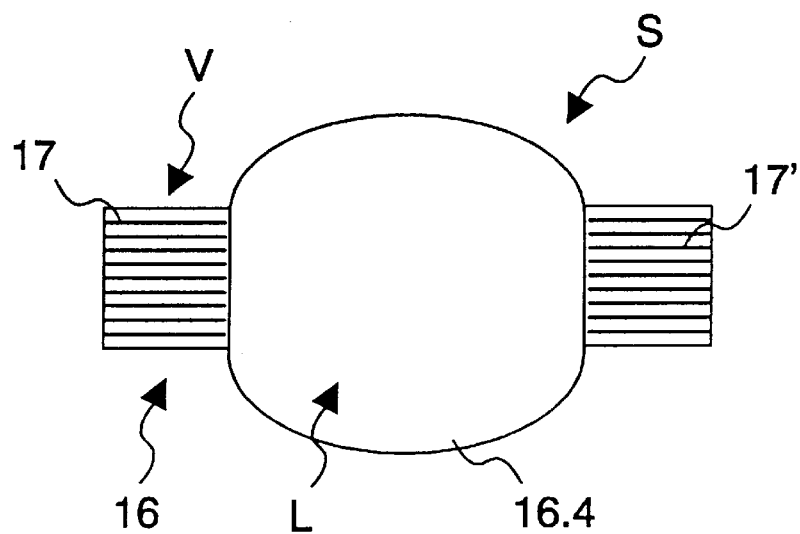
FIGS. 33 & 34 are plan and side elevations, respectively, in section of a further embodiment of a printed or foil circuit board with connecting means in the form of a circuit carrier such as a multichip module (MCM).
Figure 34:
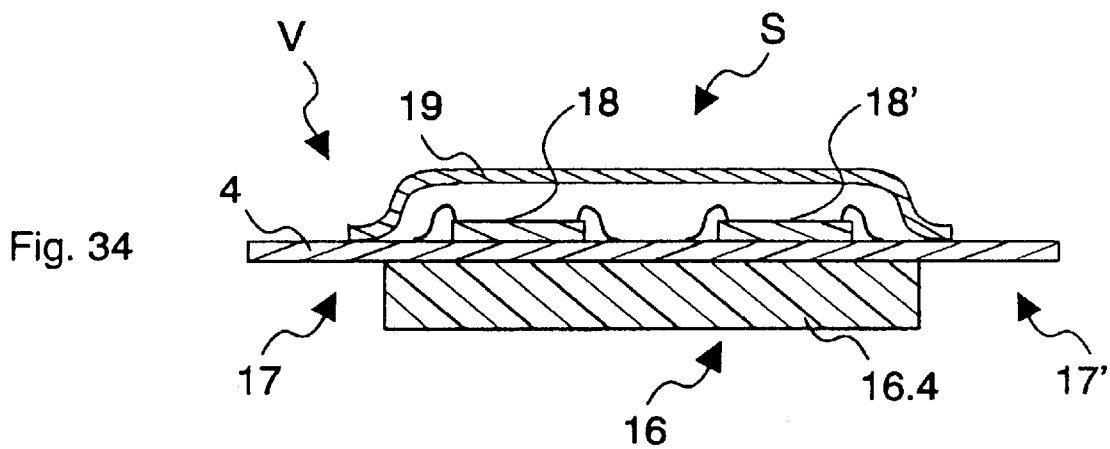

FIGS. 33 and 34 show in plan and side view another embodiment of a printed or foil circuit board with inventive connecting means V and namely as a circuit carrier S, e.g. as a multichip module (MCM). In this embodiment of a printed or foil circuit board a multilayer circuit carrier S is manufactured according to variants or in combinations of variants according to FIGS. 6 to 32, so as to provide stiff areas 16 and flexible areas 17. The stiff areas 16 represent circuit areas with user-specific and not further represented conductor patterns L, where current paths run in layers on substrates. The flexible areas 17, 17' form connecting means V as parallel current paths running against the edge of the circuit carrier S and which at this point constitute leads, i.e. similar to the embodiment of FIG. 4. The stiff areas have stiff substrates 16.4, whereas the flexible areas 17, 17' have one or more flexible substrates 4. The connecting means V are shaped as leads, so that current paths are led up to substrate ends. The circuit carrier S has wire-bonded chips 18, 18', which are protected by a metal cover 19.

Figure 35:
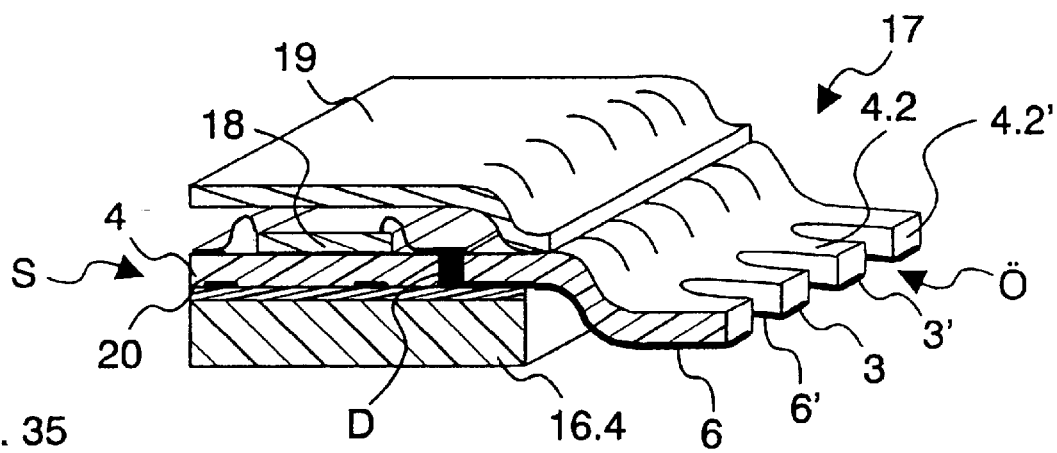
FIGS. 35 & 36 are enlarged perspective views of portions of a marginal area of the multichip module according to FIGS. 33 and 34.

FIG. 35 is a spatial view of a section of part of the marginal area of the MCM on a larger scale. It is clear that the circuit carrier S has a flexible substrate 4, e.g. an insulating layer in the form of a thin polyimide film, which carries on both sides conductor planes or current paths 6, 6', e.g. structured metal coatings and which is applied with the aid of an adhesive film 20 to the stiff substrate 16. The parallel current paths 6, 6' of the flexible area run on the side of the circuit carrier S facing the stiff substrate 16. Their ends facing the circuit carrier S form leads 3, 3', which are located on substrate ends 4.2, 4.2', which are separated from one another by slot-like openings Ö in the flexible substrate 4. These leads 3, 3' are soldered with corresponding soldering pads, e.g. to a printed or foil circuit board, the slot-like openings Ö preventing the flowing together of the solder of adjacent soldering points.

Figure 36:
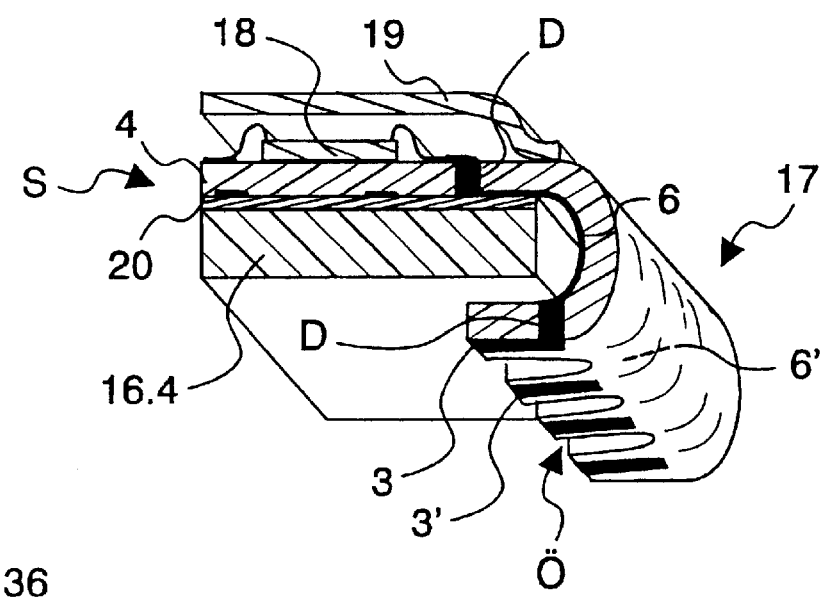

FIG. 36 shows another embodiment, in which the soldering points are not located as in FIG. 35 alongside the stiff substrate 16, but instead below the latter. The parallel, linked up current paths 6, 6' of the edge of the flexible area 17 once again run on the side of the circuit carrier S facing the stiff substrate 16.4 up to the effective soldering points for which they are led via corresponding plated-through holes D on the other side of the circuit carrier S. Here again the flowing together of the solder is prevented by slot-like openings Ö in the flexible substrate 4. The outwardly directed faces of the flexible substrate 4 consequently constitute following contacting a protection against harmful external influences of the linked up current paths 6, 6' and leads 3, 3'.

Figure 37:
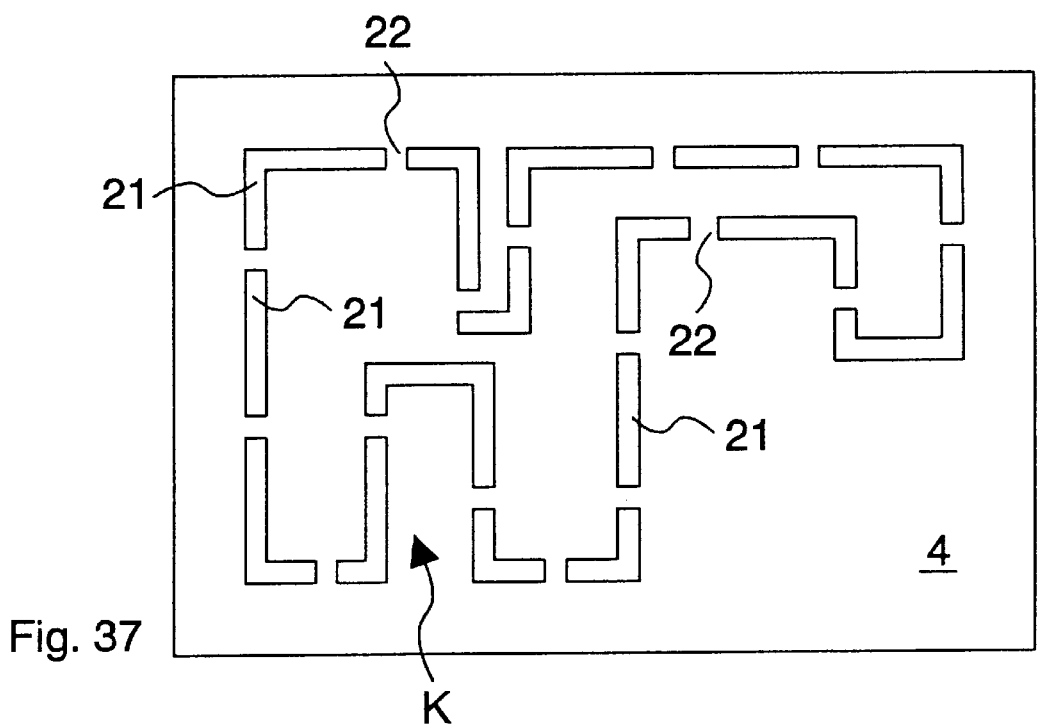
FIG 37 is a plan view of a first embodiment of complex contours in printed and foil circuit boards or corresponding semifinished product for the production thereof.

FIG. 37 diagrammatically shows as a plan view another embodiment of printed or foil circuit boards or semifinished products for the manufacture thereof with complicated contours K in the substrate. It is a rectangular substrate 4, to which are applied contour openings 21 passing through the entire material thickness. The contour openings 21 are located on the predetermined contour line of the conductor patterns or circuits to be produced and are interrupted by connecting webs 22. The not shown conductor pattern is located within the closed contour line and is in a finished state. The position of the connecting webs 22 is intended to ensure that the potential circuit is so secured in the substrate 4 that it can be easily manipulated during processing steps, which follow the steps in which the contour openings 21 are produced. Advantageously the connecting webs or posts 22 are located at positions where there is no need for maximum contour precision. The connecting webs 22 can be separated easily, e.g. using scissors and there is no need to rework the contour positions of the connecting points. The contour K of the circuit can zonally coincide with the contour of the substrate 4.

As the contour openings are photochemically defined and produced by etching, there is no need to produce tools for the final cutting to size and the precision of the latter is increased. Due to the increased precision and because all the contour openings are produced simultaneously without any mechanical force action, it is easy to produce contours with spacings of approximately 0.1 mm, which is impossible by milling and is scarcely achievable by fine punching.

The contour openings can be virtually randomly narrow (down to below 0.01 mm), so that conductor patterns in the printed or foil circuit boards or semifinished product for the manufacture thereof can be very closely juxtaposed, which leads to material savings compared with the prior art processes of milling and punching.

Figure 38:
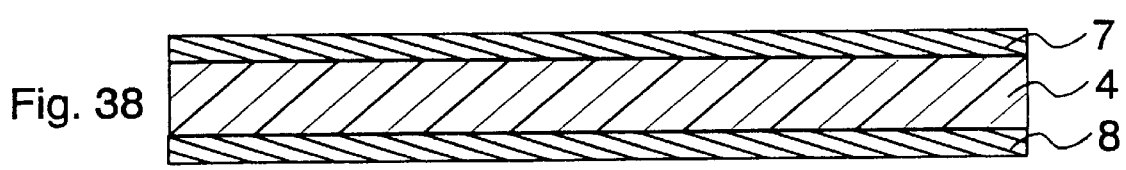
FIGS 38–40 are schematic side elevations, in section, of three stages in accordance with the method of the invention for the production of the contours of FIG. 37 from a single foil layer.
Figure 39:
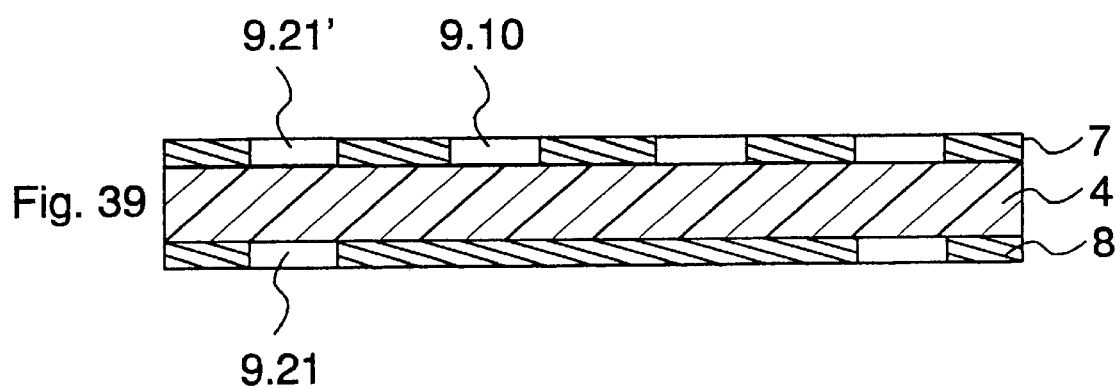
Figure 40:
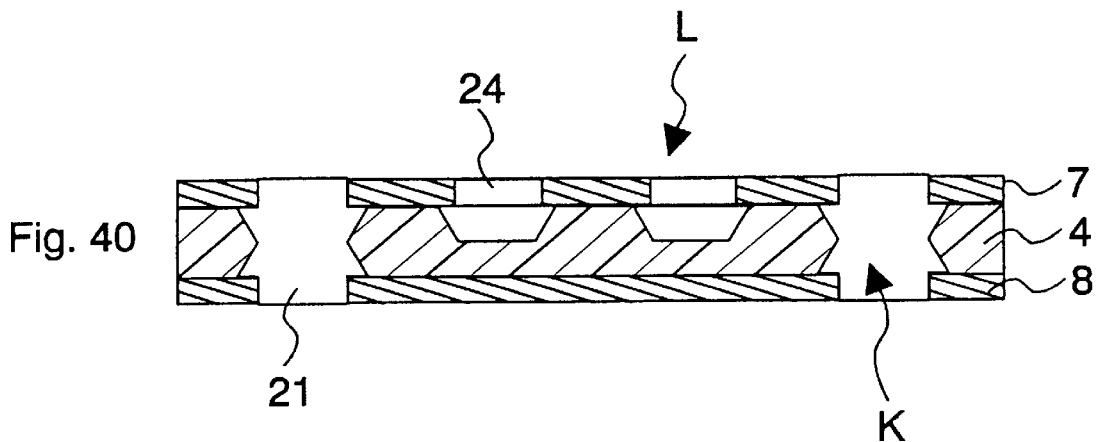

FIGS. 38 to 40 show three stages of an method variant for the production of the contours K according to FIG. 37 for a circuit with only two conductor planes. The printed or foil circuit boards or semifinished product for the manufacture thereof is made from a foil or sheet, as is shown in FIG. 38. This sheet has a central, electrically insulating layer 4, preferably of a polymer, e.g. polyimide or epoxy resin and on both sides, electrically conductive coatings 7, 8, e.g. of copper.

As shown in FIG. 39, the two conductive coatings 7 and 8 are photochemically structured using per se known methods in such a way that at the points 9.21, 9.21' of the provided contour openings on both sides the insulating layer 4 is exposed, whereas e.g. for the circuit-relevant structuring at points 9.10 the insulating layer is only exposed on one side.

If the sheet shown in FIG. 39 now undergoes a plasma etching stage, the structured sheet according to FIG. 40 is obtained if the etching parameters are matched to the material and thickness of the insulating layer 4 in such a way that roughly half its thickness is removed. The structured sheet then has through contour openings 21.

FIGS. 41 to 44 show four stages of a further exemplified method variant for producing complicated contours for a circuit according to FIG. 37 in printed or foil circuit boards or semifinished product for the manufacture thereof.

Figure 41:
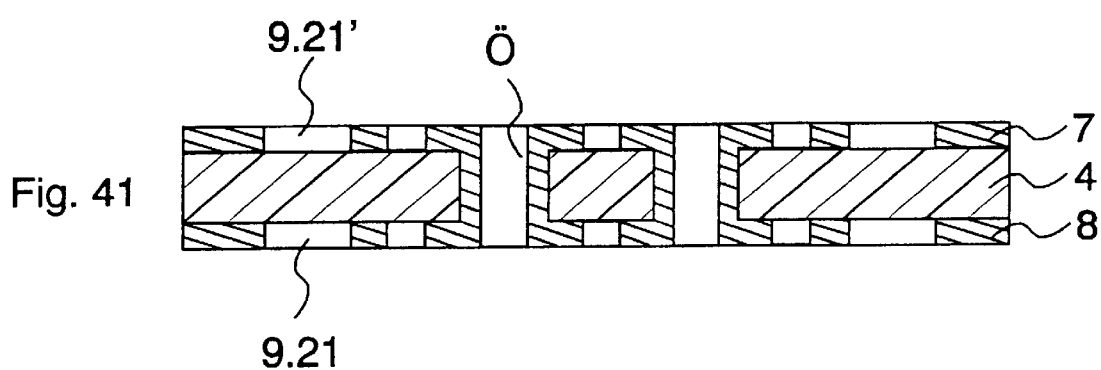
FIGS. 41–44 are schematic side elevations, in section, of four stages of a further method variant for producing the contours according to FIG. 37.

The starting product is a sheet or foil with insulating central layer 4 and conductive outer coatings 7, 8, as shown in FIG. 38. This sheet is structured for a use-specific circuit, as shown in FIG. 41, in that e.g. firstly the conductive coatings 7, 8 are so structured by photochemical processes that they free on both sides the central layer 4 at points for Z-connections, in that the openings Ö for the Z-connections are opened by dry etching and galvanically plated through and in that by photochemical processes the conductive outer coatings 7, 8 are structured to conductor patterns. As shown in FIG. 41, for contour openings, with the latter photochemical processes for producing conductor structures, areas of the central layer 4 are exposed at facing points 9.21, 9.21'.

Figure 42:
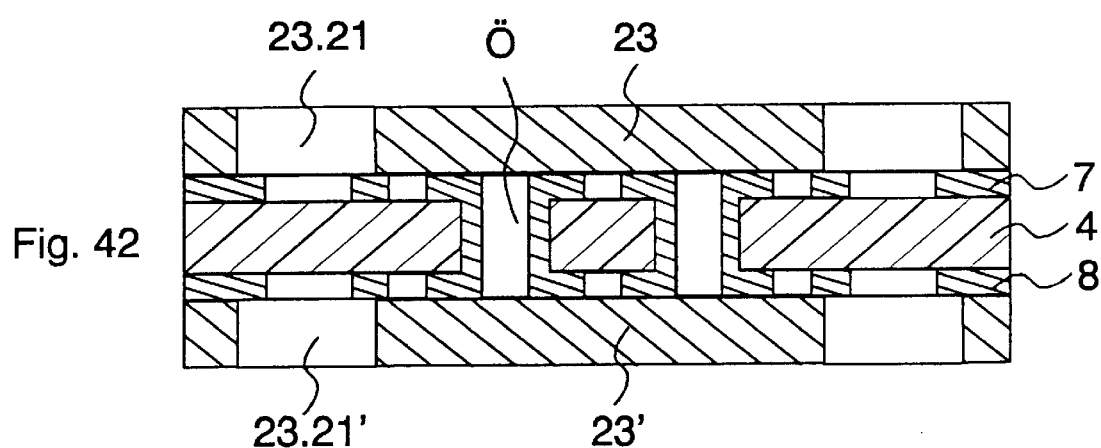

FIG. 42 shows how in a further method step where, onto the circuit finished other than for the final cut on both sides stencils 23, 23' e.g. of sheet steel are pressed, the stencils having at the points of the intended contour openings, openings 23.21 and 23.21'.

Figure 43:
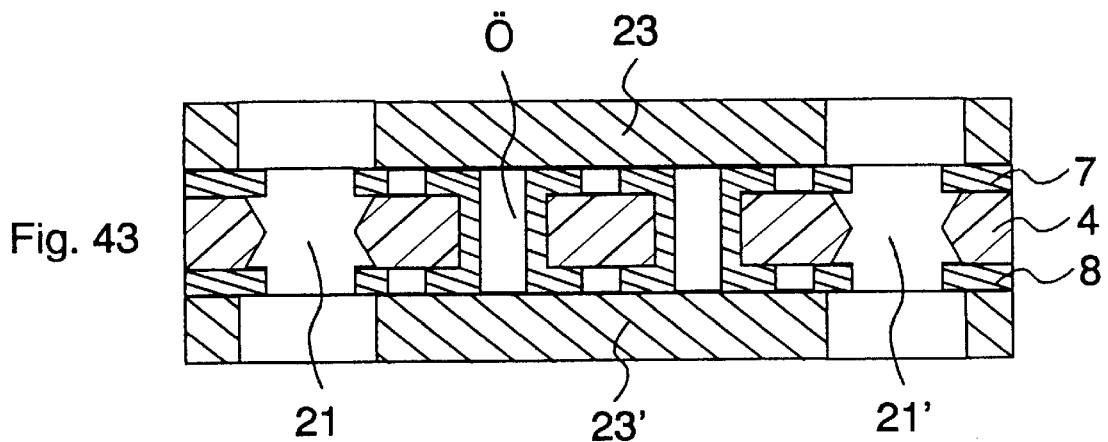

FIG. 43 shows the product with the stencils 23, 23' following a dry etching stage in which the points of the contour openings 21, 21' covered on both sides neither by the conductive coatings 7, 8, nor by the stencils 23, 23' are etched through.

Figure 44:
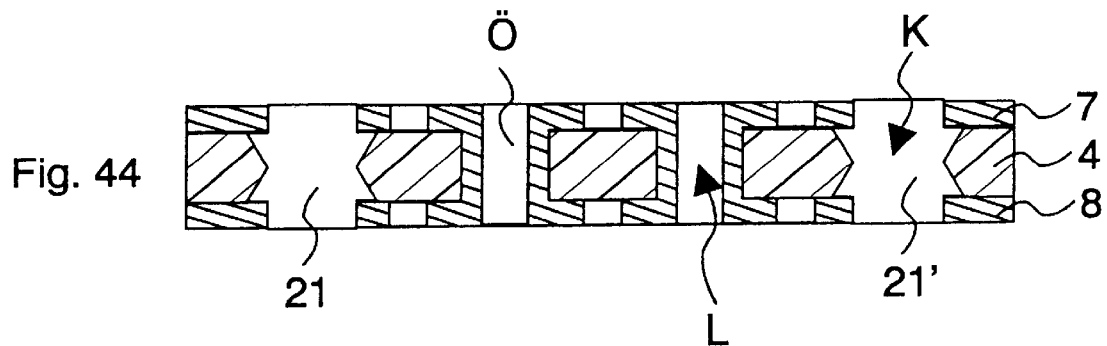

FIG. 44 shows a finished printed or foil circuit board or semifinished product for manufacturing the same with the contour openings 21, 21'.

A variant to the method of FIGS. 41 to 44 comprises the contour openings being produced together with the openings for the plated-through holes. However, it is then impossible to prevent that in the following plating-through stage also the contour openings will be "plated through", but the copper coating in the vicinity of the contour openings will be removed again during the subsequent photochemical structuring step.

Figure 45:
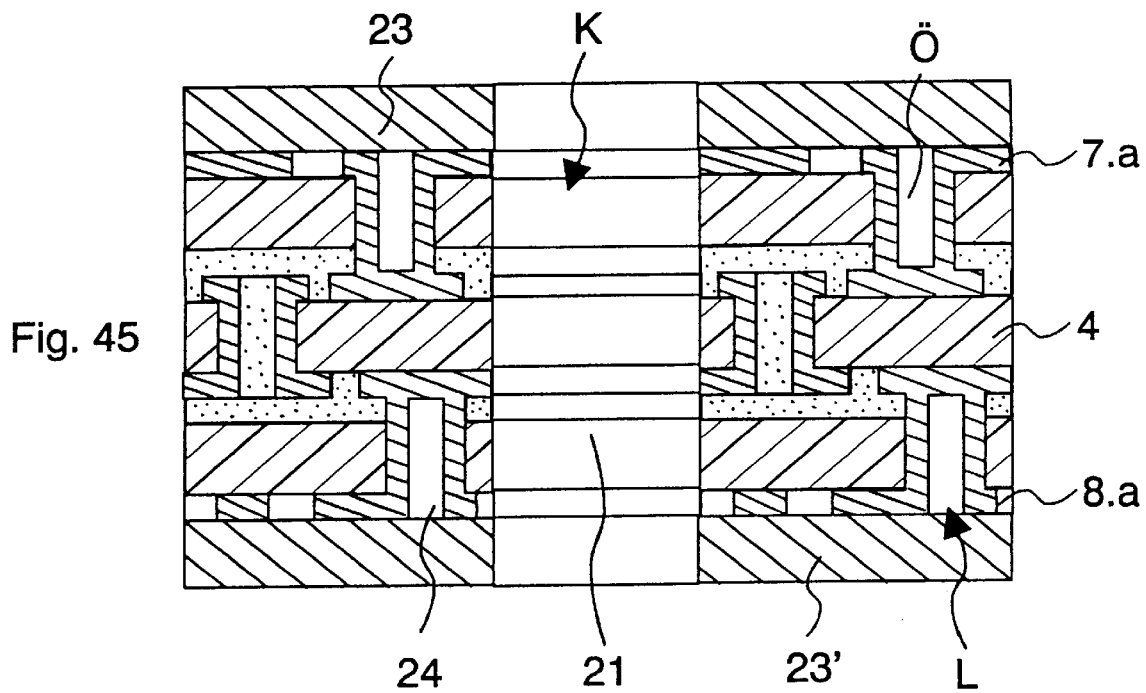
FIG. 45 is a side elevation, in section, of a method stage according to FIG. 44 for printed or foil circuit boards or semifinished products for the production thereof comprising several foil layers.

In analogy to FIG. 43, FIG. 45 shows a phase in the manufacturing method for a semifinished product, which has three foil layers. It shows the finished semifinished product on which the stencils 23 and 23' are still pressed and with the aid of which the contour openings 21 are made. This semifinished product is produced beforehand by structuring a central sheet layer using the method described in conjunction with FIG. 41. Then onto both sides is in each case laminated a further sheet layer with in each case one outer, conductive coating and it is photochemically structured by wet etching, dry etching and galvanically to in each case one further conductor plane 7a and 8a with blind holes 24 on the inner conductor planes. Both during the structuring of the inner and the outer conductor planes the conductive coatings are removed in the vicinity of the contour openings 21 to be made, so that in the vicinity of the contour openings the semifinished product only has insulating layers.

On a thus prepared semifinished product is now pressed the stencils 23 and 23', as shown in FIG. 45, which have in facing manner the openings 23.21 and 23.21' corresponding to the contour openings to be made. The semifinished product with the stencils then undergoes a dry etching stage, the etching parameters being so set that the semifinished product is at least half etched through from both sides, so that the through contour openings 21 are obtained.

Obviously the contour openings on a semifinished product, as shown in FIG. 45, can also be made in each foil layer separately together with the corresponding Z-connections. Obviously the semifinished product can also have more than three foil layers.

What is claimed is:

1. A method for the manufacture of printed and foil circuit boards and semifinished products for making printed and foil circuit boards comprising the sequence of steps of forming a preliminary product comprising a layer of dielectric substrate material having oppositely facing surfaces and first and second layers of electrically conductive material formed on said surfaces of the dielectric substrate material, selectively removing portions of the first and second layers of electrically conductive material to form circuit paths, removing portions of said dielectric substrate material and corresponding portions of said first and second layers of electrically conductive material by etching to define a plurality of substrate ends and to form an opening through the dielectric substrate material that is surrounded by said substrate material, said plurality of substrate ends extending into said opening and dividing said opening into a sequence of openings, each of said plurality of substrate ends comprising said dielectric substrate material with the first and second layers of electrically conductive material on opposite sides thereof, said plurality of substrate ends defining a predetermined pattern of connector means for connecting the circuit paths formed in said first and second layers of electrically conductive material to components on the circuit board and circuits external to the preliminary product, the connector means constituting an integral part of the preliminary product.

2. A method according to claim 1 wherein the sequence of steps includes selectively photochemically removing portions of the first and second layers of electrically conductive material to form the circuit paths, and wherein the step of forming openings through the conductive material and dielectric substrate material to constitute electrical connector portions includes plasma-etching openings through the dielectric substrate material adjacent edges of the circuit paths.

3. A method according to claim 1 wherein the connector means comprises a plurality of connecting leads, and including the step of bending at least one connecting lead out of a plane of the conductive layer.

4. A method according to claim 1 wherein the step of selectively removing portions of the first and second layers of electrically conductive material comprises photochemically forming the circuit paths in the conductive layers so that the paths lead to said connector means at edges of the printed and foil circuit boards.

5. A method according to claim 4 wherein the connector means comprises spaced apart strips of nonconductive material at an edge of a printed or foil circuit board with circuit paths thereon, the method including adding electrically conductive material by plating the ends and sides of said strips and circuit paths on the strips so that at least some strips dielectric substrate portions of the strips are completely surrounded by conductive material.

6. A method according to claim 1 including forming contour openings through the dielectric substrate material to define separation lines along which a portion of a circuit board can be separated from the board after processing, comprising forming sequences of openings through the electrically conductive and dielectric substrate material, the openings being separated by connecting webs of dielectric substrate material.

7. A method according to claim 6 and including concurrently etching contour openings and openings for use as connections perpendicular to planes of the electrically conductive material and dielectric substrate material.

8. A method according to claim 6 comprising, after the step of selectively removing from both sides of the preliminary product areas of electrically conductive material to form circuit paths on both sides of the dielectric substrate material including removing electrically conductive material at locations for contour openings, pressing stencils against both sides of the preliminary product, the stencils having openings therethrough at locations for the contour openings, and dry etching the dielectric substrate material at the locations in the stencils for the contour openings, including selecting the etching parameters to etch through at least half the thickness of the material to be etched through.

9. A method according to claim 8 and including, between the step of removing the areas of conductive material and the step of pressing the stencils, the step of laminating additional preliminary products on one or both sides of the product, the additional preliminary products each comprising a layer of dielectric substrate material with first and second electrically conductive material on opposite sides thereof and with patterns of circuit paths formed in the electrically conductive material and with the electrically conductive material removed in areas for intended contour openings.

10. A method according to claim 6 including the steps of photochemically selectively removing from only one side of the preliminary product areas of electrically conductive material to form circuit paths on both sides of the dielectric substrate material layers and including removing electrically conductive material at locations for contour openings, dry etching the nonconductive material at locations in the stencils for the contour openings, including selecting the etching parameters to etch through at least half the thickness of the material to be etched through.

11. A method for the manufacture of printed and foil circuit boards and semifinished products for making printed and foil circuit boards comprising the sequence of steps of forming a preliminary product comprising a layer of dielectric substrate material having oppositely facing surfaces and first and second layers of electrically conductive material formed on said surfaces of the dielectric substrate material and a conductive strip embedded in the dielectric substrate material and isolated from the layers of electrically conductive material, selectively removing portions of the first and second layers of electrically conductive material to form circuit paths on said substrate surfaces, removing portions of said dielectric substrate material and corresponding portions of said first and second layers of electrically conductive material by etching to define a plurality of substrate ends and to form an opening through the dielectric substrate material that is surrounded by said substrate material, said plurality of substrate ends extending into said opening and dividing said opening into a sequence of openings, each of said plurality of substrate ends comprising said dielectric substrate material with the first and second layers of electrically conductive material on opposite sides thereof, said plurality of substrate ends defining a predetermined pattern of connector means for connecting the circuit paths formed in said first and second layers of electrically conductive material to components on the circuit board and circuits external to the preliminary product, the connector means constituting an integral part of the preliminary product, photochemically removing selected portions of the electrically conductive material so that the embedded conductive strip lies between conductive paths on opposite sides of said nonconductive layer, thereby forming a shielded cable strip, at an edge of the board, forming connector openings through the electrically conductive material and dielectric substrate material with the shielded cable strip and conductive paths therebetween, and plating around the shielded cable strip and conductive circuit paths through the connector openings with electrically conductive material.

12. A method according to claim 11 and including forming separate ends of dielectric substrate material at an edge of the dielectric substrate material with conductive paths thereon by removing nonconductive material between protruding strips thereof.

13. A printed or foil circuit board comprising a substrate comprising a layer of electrically nonconductive material having oppositely facing surfaces and at least one electrically conductive member between said surfaces, said electrically conductive member being completely surrounded by said electrically nonconductive material;

first and second layers of electrically conductive material on said surfaces of said substrate, said layers of electrically conductive material having portions thereof selectively removed to leave a predetermined pattern of conductive paths on said surfaces of said substrate;

a plurality of openings through said substrate separating said conductive paths from each other;

said conductive member extending between said openings, said conductive paths extending parallel with said conductive member and between said openings; and conductive material plated on said paths and said substrate through said openings to surround said conductive member and form a shielded conductor.

14. A circuit board according to claim 13 wherein said shielded conductor is formed with selectively severable portions of reduced width whereby a conductive path leading to a severable portion is bendable to form a conductive lead.

15. A circuit board according to claim 14 wherein said conductive member extends to an edge of said substrate.

16. A circuit board according to claim 15 wherein said conductive member has uniform cross-sectional dimensions selected to carry electrical signals higher than 1 GHz.

* * * * *

UNITED STATES PATENT AND TRADEMARK OFFICE
CERTIFICATE OF CORRECTION

PATENT NO. : 6,218,628 B1  
DATED : April 17, 2001  
INVENTOR(S) : Schmidt et al.

Page 1 of 1

It is certified that error appears in the above-identified patent and that said Letters Patent is hereby corrected as shown below:

Column 4,  
Line 11, after "of", delete "according to".  
Line 17, after "FIG. 2 is a schematic plan view of", insert -- part of --.

Column 5,  
Line 46, delete "µu" and insert -- µm --.

Column 6,  
Line 9, after "same", delete "method".  
Line 41, delete "separately" and insert -- separated --.

Column 7,  
Line 17, delete "98p" and insert -- 9.8p --.

Column 8,  
Line 60, delete "," (comma) and insert -- to --.  
Line 67, delete "15-15" (second occurance).

Column 9,  
Line 33, delete "0" and insert --Ö--.

Column 10,  
Line 1, delete "Pointlessly" and insert -- jointlessly --.

Column 11,  
Line 18, delete "She" an insert -- the --.

Signed and Sealed this

Fourteenth Day of May, 2002

Attest:

Attesting Officer

JAMES E. ROGAN  
*Director of the United States Patent and Trademark Office*